(12) United States Patent
Piccardi

(10) Patent No.: US 10,867,684 B1
(45) Date of Patent: Dec. 15, 2020

(54) DRIVING ACCESS LINES TO TARGET VOLTAGE LEVELS

(71) Applicant: MICRON TECHNOLOGY, INC., Boise, ID (US)

(72) Inventor: Michele Piccardi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/699,882

(22) Filed: Dec. 2, 2019

Related U.S. Application Data

(60) Provisional application No. 62/893,403, filed on Aug. 29, 2019.

(51) Int. Cl.
| | | |
|---|---|---|
| *G11C 8/08* | (2006.01) | |
| *G11C 16/30* | (2006.01) | |
| *G11C 16/08* | (2006.01) | |
| *G11C 16/04* | (2006.01) | |

(52) U.S. Cl.
CPC .......... *G11C 16/30* (2013.01); *G11C 16/0483* (2013.01); *G11C 16/08* (2013.01)

(58) Field of Classification Search
CPC ........................................................ G11C 8/08
USPC ...................................................... 365/185.23
See application file for complete search history.

(56) References Cited

U.S. PATENT DOCUMENTS

| | | | | |
|---|---|---|---|---|
| 9,659,602 | B2 * | 5/2017 | Qiao | G11O 5/147 |
| 2006/0245260 | A1 * | 11/2006 | Kim | G11C 16/3418 |
| | | | | 365/185.23 |
| 2006/0291293 | A1 * | 12/2006 | Chae | G11C 8/08 |
| | | | | 365/185.23 |
| 2014/0369125 | A1 * | 12/2014 | Della Mina | G11C 16/10 |
| | | | | 365/185.12 |
| 2018/0254087 | A1 * | 9/2018 | Yamaoka | G11C 16/10 |
| 2019/0378580 | A1 * | 12/2019 | Zhao | G11C 16/08 |
| 2020/0202903 | A1 * | 6/2020 | Yoshihara | G11C 16/08 |

OTHER PUBLICATIONS

De Santis, L.; "Apparatus and Methods for Performing Concurrent Access Operations on Different Groupings of Memory Cells", U.S. Appl. No. 16/454,461, filed Jun. 27, 2019; Total pp. 58.
Piccardi, M. et al.; "Memory Devices Including Voltage Generation Systems", U.S. Appl. No. 16/411,210, filed May 14, 2019, Total pp. 36.

* cited by examiner

*Primary Examiner* — Min Huang
(74) *Attorney, Agent, or Firm* — Dicke, Billig & Czaja, PLLC

(57) ABSTRACT

Methods of operating a memory, and apparatus having a configuration to perform similar methods, might include connecting an access line of a plurality of access lines to an output of a voltage generation system and isolating the access line from an output of a voltage regulator, determining whether a particular voltage level of the voltage generation system makes a particular transition from a voltage level lower than a threshold to a voltage level higher than the threshold after connecting the access line to the output of the voltage generation system, and connecting the access line to the output of the voltage regulator in response to determining that the particular voltage level of the voltage generation system made the particular transition.

25 Claims, 15 Drawing Sheets

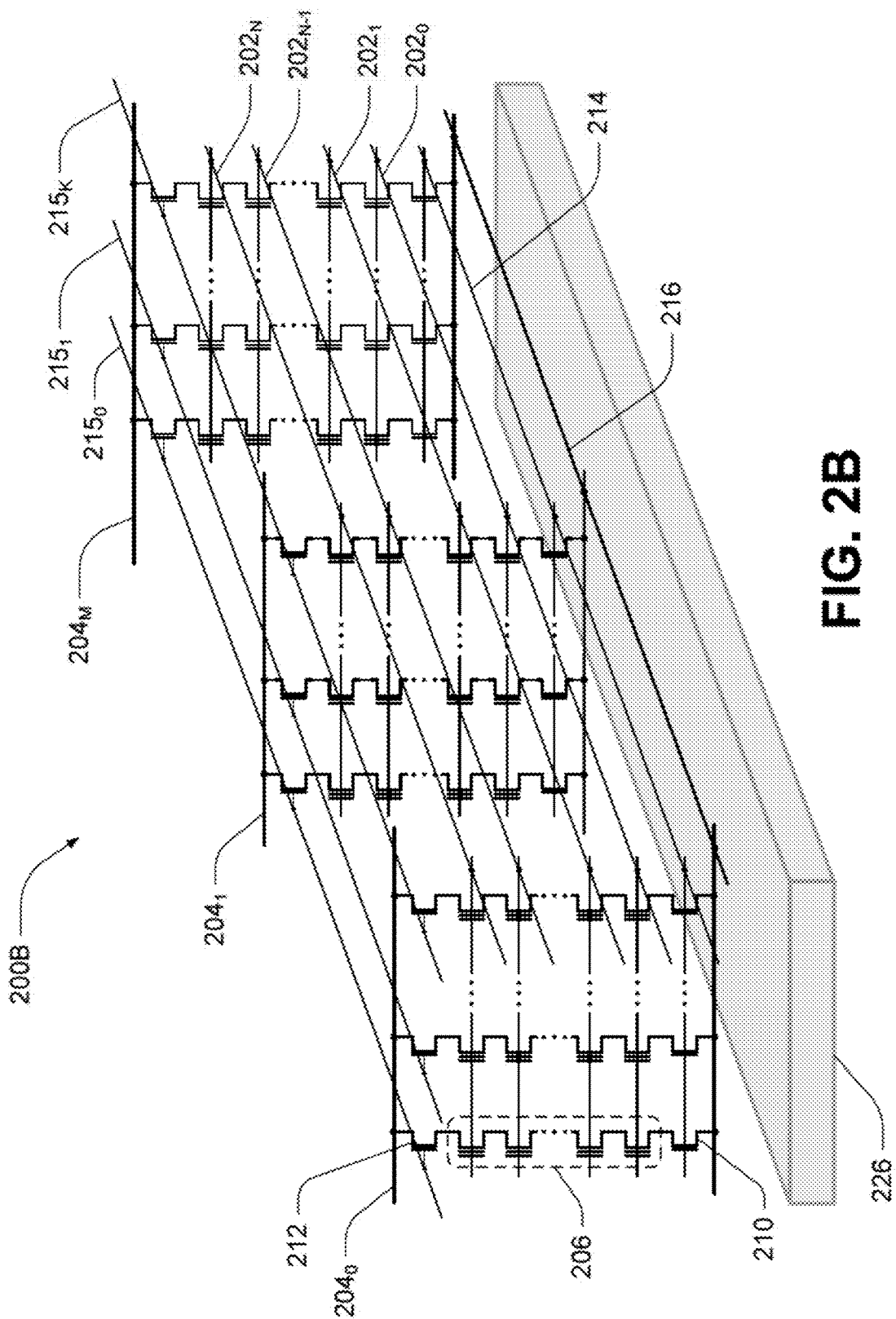

| $242_0$ | $242_1$ | $242_2$ | $242_3$ |
|---|---|---|---|
| Block$_0$ 250$_0$ | Block$_0$ 250$_0$ | Block$_0$ 250$_0$ | Block$_0$ 250$_0$ |
| Block$_1$ 250$_1$ | Block$_1$ 250$_1$ | Block$_1$ 250$_1$ | Block$_1$ 250$_1$ |
| Block$_2$ 250$_2$ | Block$_2$ 250$_2$ | Block$_2$ 250$_2$ | Block$_2$ 250$_2$ |
| Block$_3$ 250$_3$ | Block$_3$ 250$_3$ | Block$_3$ 250$_3$ | Block$_3$ 250$_3$ |
| Block$_4$ 250$_4$ | Block$_4$ 250$_4$ | Block$_4$ 250$_4$ | Block$_4$ 250$_4$ |
| ⋮ | ⋮ | ⋮ | ⋮ |
| Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
| Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
| Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
| Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
| Block$_L$ 250$_L$ | Block$_L$ 250$_L$ | Block$_L$ 250$_L$ | Block$_L$ 250$_L$ |
| 240$_0$ | 240$_1$ | 240$_2$ | 240$_3$ |

DRIVING ACCESS LINES TO TARGET VOLTAGE LEVELS

RELATED APPLICATION

This application claims the benefit of U.S. Provisional Application No. 62/893,403, filed on Aug. 29, 2019, hereby incorporated herein in its entirety by reference.

TECHNICAL FIELD

The present disclosure relates generally to integrated circuit operation, and, in particular, in one or more embodiments, the present disclosure relates to driving access lines to target voltage levels.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is deemed to be activated in response to a particular voltage applied to its control gate, such as by detecting whether a data line connected to the memory cell experiences a sufficient change in voltage level caused by current flow through the memory cell. As memory operation advances to represent additional data states per memory cell, the margins between adjacent Vt ranges can become smaller. This can lead to an inaccurate determination of the data state of a sensed memory cell if excessive levels of electrical noise are introduced during the sensing operation.

BRIEF DESCRIPTION OF THE DRAWINGS

FIGS. 2A-2D are schematics of portions of an array of memory cells as could be used in a memory of the type described with reference to FIG. 1.

DETAILED DESCRIPTION

Figure 1:
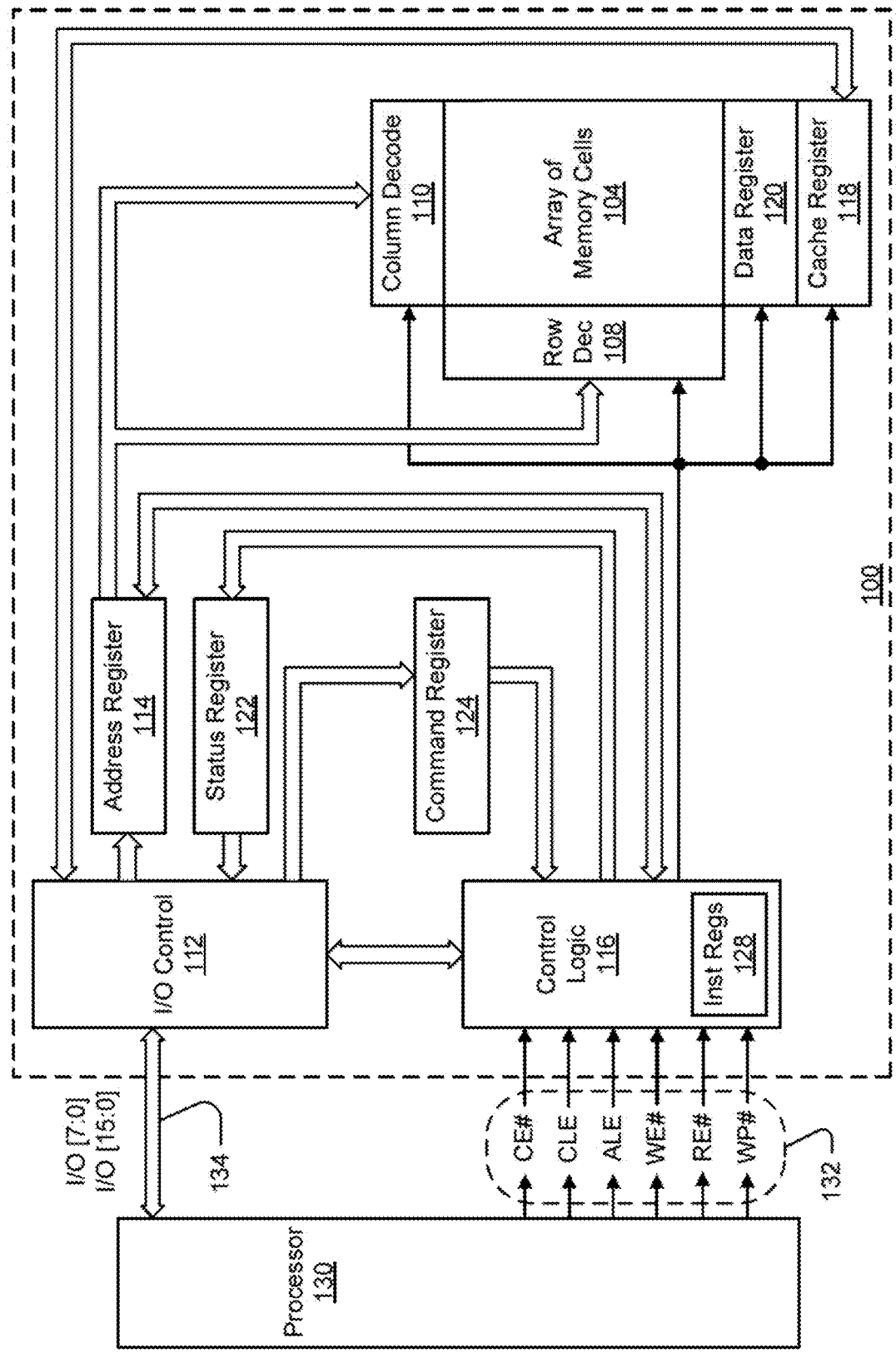
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Concurrent access operations on multiple groupings of memory cells can introduce electrical noise as individual access operations request current from voltage generators to pre-charge nodes, e.g., access lines, select lines or data lines, to desired voltage levels to perform those access operations. Such electrical noise might impact the ability to accurately determine an intended data state. Various embodiments seek to mitigate the impact of electrical noise during noise-sensitive periods of concurrent access operations.

As used herein, multiple acts being performed concurrently will mean that each of these acts is performed for a respective time period, and each of these respective time periods overlaps, in part or in whole, with each of the remaining respective time periods. In other words, portions of those acts coincide for at least some period of time.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104, and might be configured to perform methods in accordance with embodiments. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
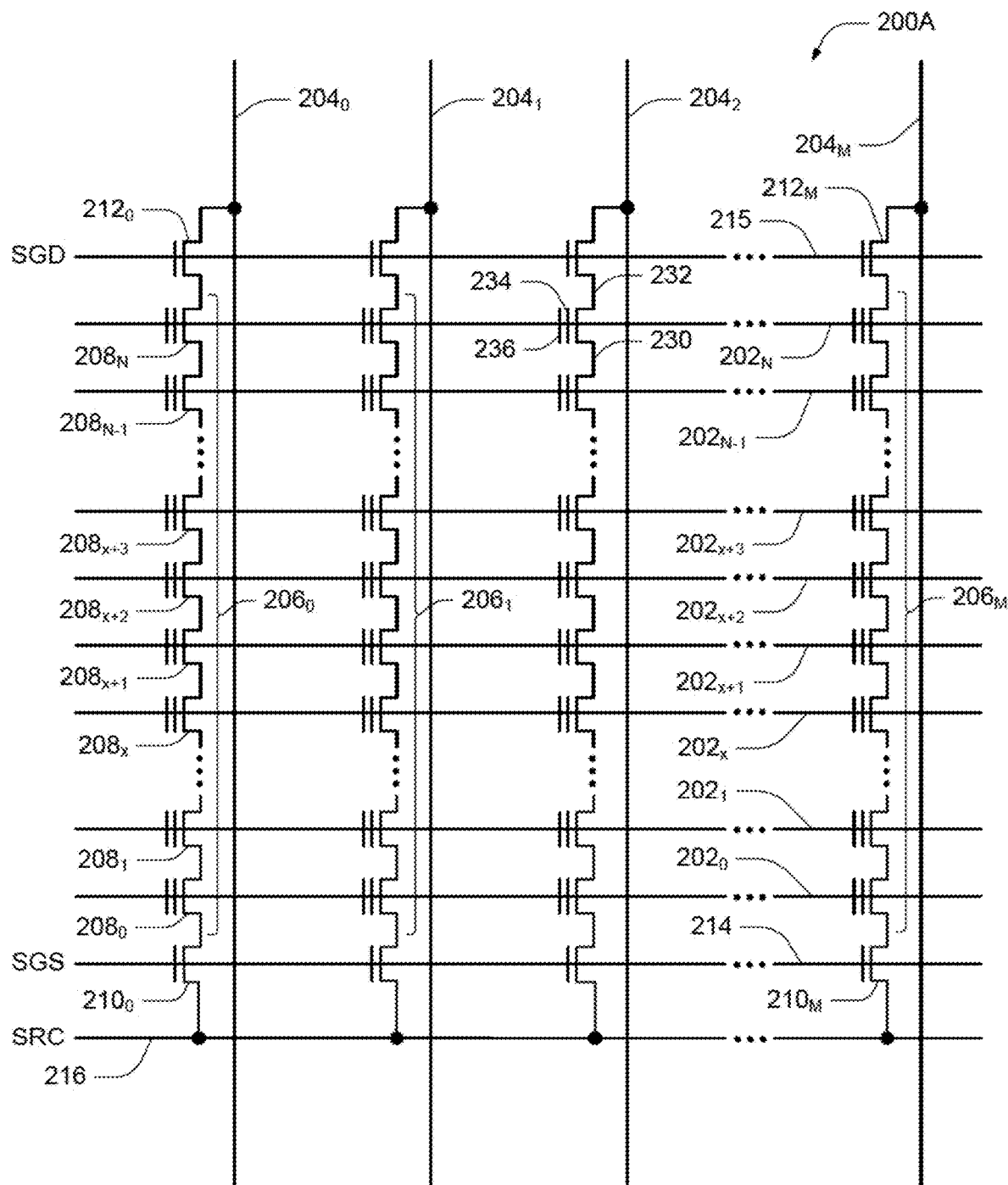

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
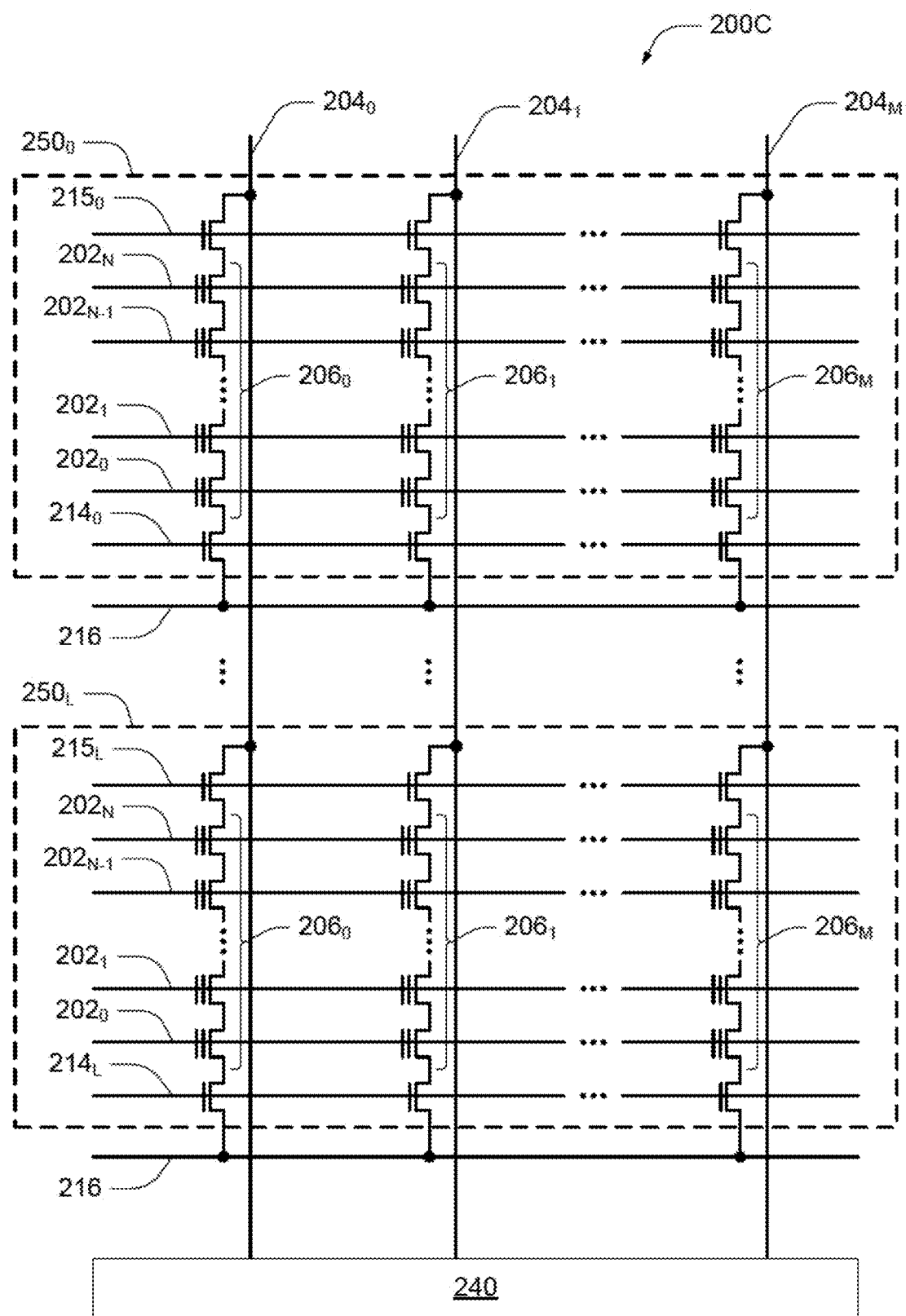

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

The data lines $204_0$-$204_M$ might be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

FIG. 2D is a block schematic of a portion of an array of memory cells as could be used in a memory of the type described with reference to FIG. 1. The array of memory cells 200D is depicted to have four memory planes 242 (e.g., memory planes $242_0$-$242_3$), each in communication with a respective buffer portion 240 (e.g., buffer portions $240_0$-$240_3$), which might collectively form a data buffer (e.g., page buffer) 244. While four memory planes 242 are depicted, other numbers of memory planes 242 might be commonly in communication with a data buffer 244. Each memory plane 242 is depicted to include L+1 blocks of memory cells 250 (e.g., blocks of memory cells $250_0$-$250_L$).

Figure 3:
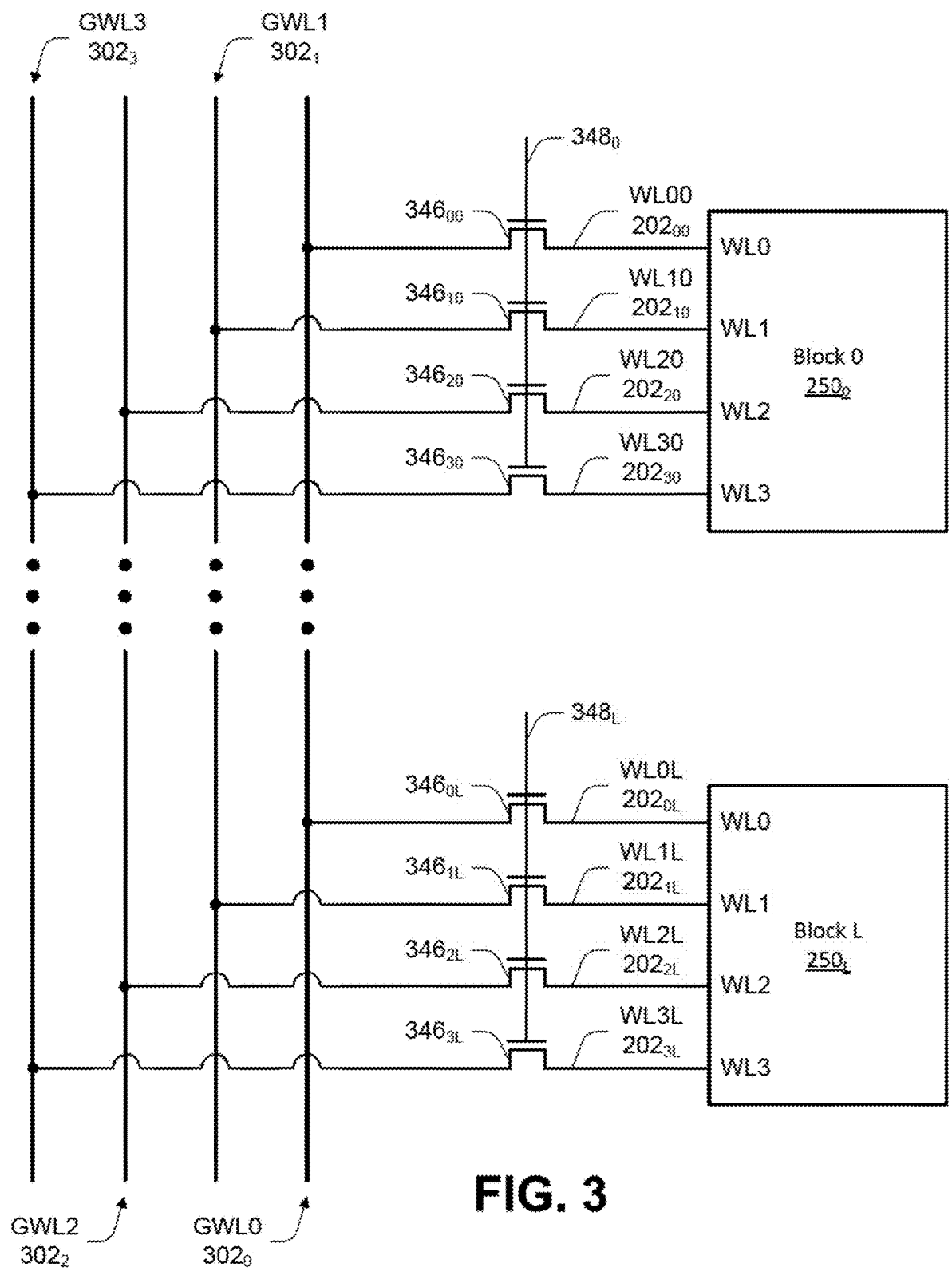
FIG. 3 is a schematic of a portion of an array of memory cells and string drivers as could be used in a memory device of the type described with reference to FIG. 1.

FIG. 3 is a schematic of a portion of an array of memory cells and string drivers as could be used in a memory device of the type described with reference to FIG. 1 and depicting a many-to-one relationship between local access lines (e.g., local word lines) 202 and global access lines (e.g., global word lines) 302.

As depicted in FIG. 3, a plurality of blocks of memory cells 250 might have their local access lines (e.g., local word lines) 202 commonly selectively connected to a plurality of global access lines (e.g., global word lines) 302. Although FIG. 3 depicts only blocks of memory cells $250_0$ and $250_L$ (Block 0 and Block L), additional blocks of memory cells 250 might have their local access lines 202 commonly connected to global access lines 302 in a like manner. Similarly, although FIG. 3 depicts only four local access lines 202, blocks of memory cells 250 might include fewer or more local access lines 202. The blocks of memory cells $250_0$-$250_L$ might belong to a single plane of memory cells 242.

To facilitate memory access operations to specific blocks of memory cells 250 commonly coupled to a given set of global access lines 302, each block of memory cells 250 might have a corresponding set of block select transistors 346 in a one-to-one relationship with their local access lines 202. Control gates of the set of block select transistors 346 for a given block of memory cells 250 might have their control gates commonly connected to a corresponding block select line 348. For example, for block of memory cells $250_0$, local access line $202_{00}$ might be selectively connected to global access line $302_0$ through block select transistor $346_{00}$, local access line $202_{10}$ might be selectively connected to global access line $302_1$ through block select transistor $346_{10}$, local access line $2022_{20}$ might be selectively connected to global access line $302_2$ through block select transistor $346_{20}$, and local access line $202_{30}$ might be selectively connected to global access line $302_3$ through block select transistor $346_{30}$, while block select transistors $346_{00}$-$346_{30}$ are responsive to a control signal received on block select line $348_0$. The block select transistors 346 for a block of memory cells 250 might collectively be referred to as a string driver, or simply driver circuitry.

Figure 4:
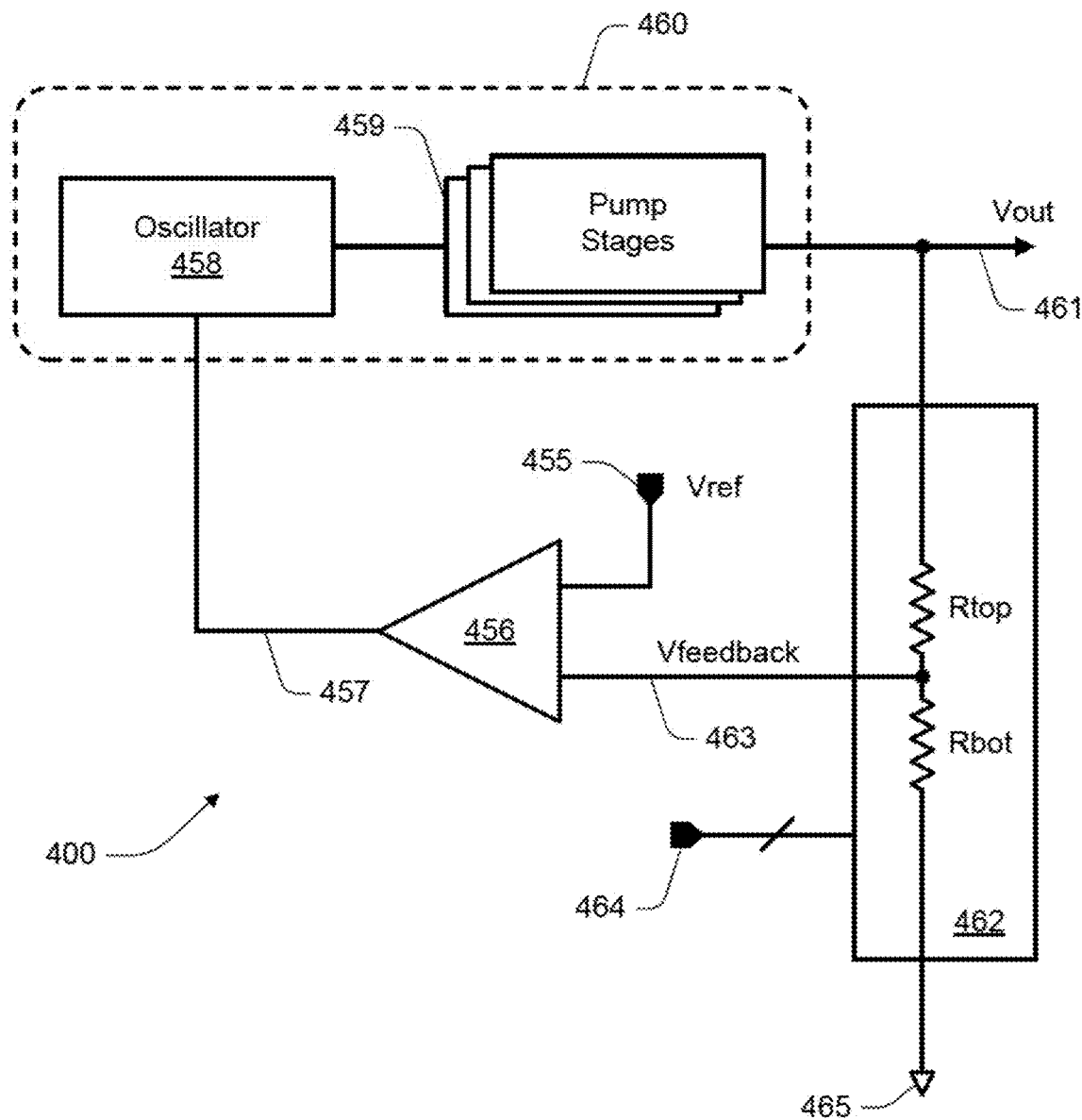
FIG. 4 is a block schematic of a voltage generation system as might be used with embodiments.

FIG. 4 is a block schematic of a voltage generation system 400 as might be used with embodiments. The voltage generation system 400 might be responsive to an analog control signal, e.g., Vref, received on control signal node 455, that might be generated by a digital to analog converter (DAC) (not depicted in FIG. 4). The control signal Vref might be provided to one input of a comparator 456. The output 457 of comparator 456 might be provided, e.g., as an enable signal, to an oscillator 458. Oscillator 458 might selectively provide an output (e.g., a clock signal) in response to the output of the comparator 456. The output of oscillator 458 might be provided to one or more pump stages (e.g., charge pump stages) 459. Pump stages 459 might represent any circuit capable of generating a voltage having a magnitude greater than a supply voltage provided to pump stages 459 and/or a polarity different than the supply voltage. Oscillator 458 and pump stages 459 might be collectively referred to as a voltage generation circuit 460. For example, the voltage generation circuit 400 might represent a charge pump, operation of which might be described generally with reference to U.S. Pat. No. 9,659,602 to Qiao et al. The output of pump stages 459 might represent the voltage level, e.g., Vout, generated at the output 461 of the voltage generation circuit 460. Voltage generation circuit 460 might alternatively include any circuit configured to generate a voltage level responsive to a level of an input control signal, e.g., the output 457 of comparator 456.

To adjust a voltage level of Vout, and to increase stability of the voltage level, Vout might be provided to voltage divider 462 for feedback to the comparator 456. Voltage divider 462 is conceptually depicted as having an output 463 between a top resistance Rtop and a bottom resistance Rbot. Voltage divider 462 might be an adjustable voltage divider, responsive to control signals 464, e.g., received from control logic 116, to alter a resistance ratio of Rtop/(Rtop+Rbot). Voltage divider 462 might be further coupled to a voltage node 465. Voltage node 465 might be coupled to receive a reference potential, e.g., 0V, ground or Vss. The output 463 of voltage divider 462 might assume a voltage level, e.g., Vfeedback, between Vout and the voltage level of the voltage node 465, depending upon the resistance ratio of the voltage divider 462. Vfeedback might be provided to a second input of comparator 456, thereby generating an output signal of the comparator 456 having a first logic level, e.g., a logic low level, when a voltage level of Vout results in a voltage level of Vfeedback that is lower than the voltage level of Vref, and having a second logic level, e.g., a logic high level, when a voltage level of Vout results in a voltage level of Vfeedback that is higher than the voltage level of Vref.

Figure 5:
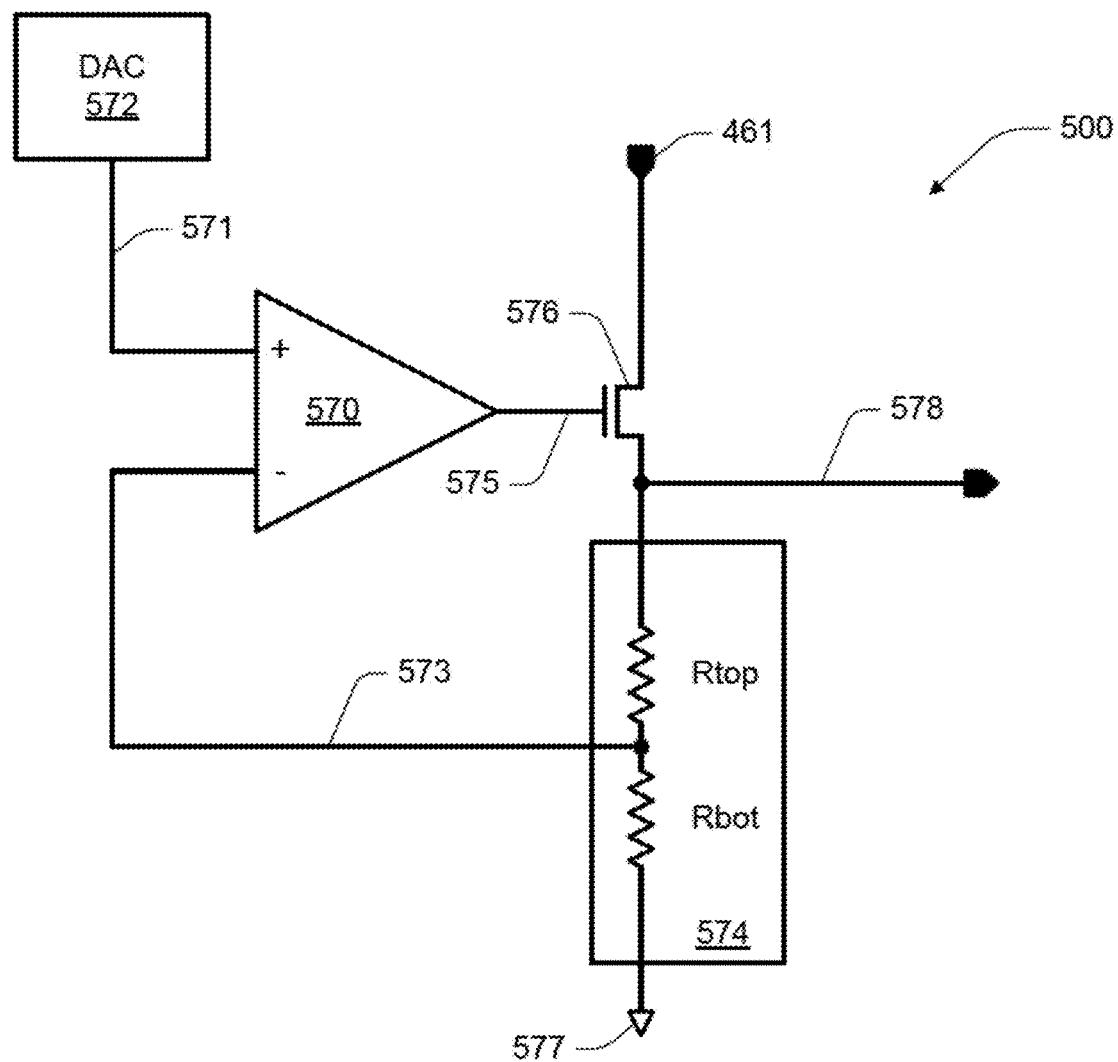
FIG. 5 is a block schematic of a voltage regulator as might be used with embodiments.

FIG. 5 is a block schematic of a voltage regulator 500 as might be used with embodiments. Voltage regulators for use with embodiments might include any circuit configured to generate an output voltage level that is lower (e.g., down-regulated) than its input voltage level, e.g., the voltage level of the output 461 of the voltage generation circuit 460, and having less electrical noise than its input voltage level, in response to a control signal (e.g., the voltage level of an output 571 of a DAC 572) indicative of a target voltage level for the voltage regulator.

The voltage regulator 500 depicted in FIG. 5 might represent a linear voltage regulator. The voltage regulator 500 might include an operational amplifier (op-amp) 570 having a first input (e.g., a non-inverting or inverting input) connected to receive the output 571 of the DAC 572. The op-amp 570 might have a second input (e.g., an inverting or non-inverting input, respectively) connected to receive an output 573 of a voltage divider 574. As used herein, an operational amplifier or op-amp will refer to any circuit configured to adjust (e.g., increase or decrease) its output voltage level in response to a signal differential, and to cease adjusting its output voltage level as those signals approach equality.

The voltage divider 574 might be connected between an output 578 of the voltage regulator 500 and a voltage node 577. Voltage divider 574 is conceptually depicted as having its output 573 between a top resistance Rtop and a bottom resistance Rbot. Voltage divider 574 might be an adjustable voltage divider to alter a resistance ratio of Rtop/(Rtop+Rbot) in a manner similar to that described with reference to the voltage divider 462 of FIG. 4. Voltage divider 574 might be used to adjust the gain of the voltage regulator 500, for example. For various embodiments, the resistance ratio of the voltage divider 574 might be equal to the resistance ratio of the voltage divider 462. In this manner, the voltage level of the output 463 of the voltage divider 462 and the voltage level of the output 573 of the voltage divider 574 might be in the same domain, e.g., a same voltage level on the outputs of both voltage dividers might indicate that each is receiving a same input voltage level.

The op-amp 570 might have its output 575 connected to a control gate of a transistor (e.g., nFET) 576. The transistor 576 might have a first source/drain (e.g., drain) connected to receive the output 461 of the voltage generation circuit 460 as an input to the voltage regulator 500, and might have a second source/drain (e.g., source) connected to the output 578. The transistor 576 might act as a source follower, and might facilitate maintaining the output 578 of the voltage regulator 500 at a voltage level substantially equal to (e.g., at the first order) a voltage level of the output 575 of the op-amp 570 minus a threshold voltage of the transistor 576, provided the voltage level of the output 461 of the voltage generation circuit 460 is higher than one threshold voltage above the voltage level of the output 575.

Figure 6:
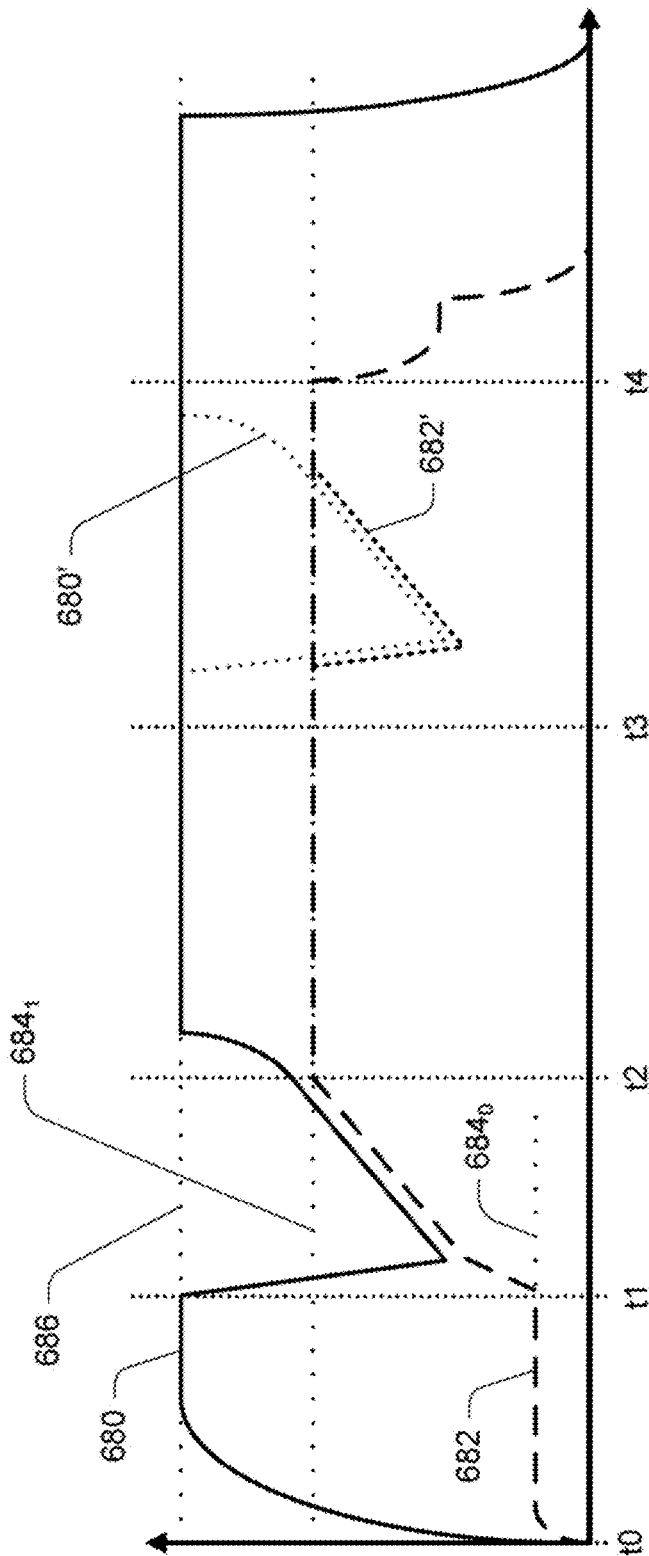
FIG. 6 is a timing diagram of voltage generation and regulation of the related art.

FIG. 6 is a timing diagram of voltage generation and regulation of the related art. Performing access operations on a memory might include sensing operations (e.g., read operations and/or verify operations), programming operations and/or erase operations. In general, access operations involve the application of various voltage levels to access lines and data lines. The various voltage levels involved in an access operation might typically be generated by respective voltage generation systems and respective voltage regulators.

Using a sensing operation in a NAND memory having a number of access lines connected to control gates of memory cells of a string of series-connected memory cells as an example, a selected access line connected to a control gate of a memory cell of the string selected for sensing might receive a voltage level to selectively activate that memory cell depending upon its data state, while remaining unselected access lines connected to control gates of other memory cells of the string might receive voltage levels, e.g., pass voltages, sufficient to activate those memory cells regardless of their data states. While one pass voltage might be used, it is not uncommon for a number of different pass voltages to be used. Each pass voltage might be generated using a respective voltage generation system and a respective voltage regulator. While each pass voltage might be generated using a respective voltage generation system and a respective voltage regulator, its respective voltage regulator might be connected to each unselected access line designated to receive that pass voltage during the sensing operation, which could include each access line connected to the string of series-connected memory cells other than the selected access line.

With reference to FIG. 6, trace 680 might represent a voltage level of an output of a voltage generation system while trace 682 might represent a voltage level of an output of a voltage regulator connected to receive the output of the voltage generation system. The dotted line $684_0$ might represent an initial target voltage level of the voltage regulator, the dotted line $684_1$ might represent a target voltage level of the voltage regulator for performing the access operation, and the dotted line 686 might represent a target voltage level of the voltage generation system for performing the access operation.

At time t0, the voltage generation system and the voltage regulator might be activated, and might rise to their target voltage levels 686 and $684_0$, respectively. At time t1, the target voltage level for the voltage regulator might be changed to the target voltage level $684_1$, and the output of the voltage regulator might be connected to the unselected access lines. Due to the capacitance of the unselected access lines, and the resulting increase in load of the voltage generation system, trace 680 might experience a large drop before increasing its voltage level back to its target voltage level 686. It is noted that during this charging of the unselected access lines to their pass voltage, the selected access line might also be connected to the output of the voltage regulator to mitigate the effects of capacitive coupling during this charging phase before connecting it to a different voltage regulator for its desired voltage level. Trace 682 might generally follow the voltage level of trace 680 until it reaches its target voltage level $684_1$ at time t2. Traces 680 and 682 might be allowed to come to steady state between time t2 and time t3, before starting a sensing phase of the sensing operation between time t3 and time t4. During this period of time, e.g., t3 to t4, it is generally desirable to maintain trace 682 at a stable voltage level for reliable sensing of the data state of the selected memory cell. After the sensing phase is complete at time t4, the voltage levels of the voltage regulator and voltage generation system might be discharged.

Such sensing in prior art memories has been generally effective for sensing of a single plane of memory cells, or sensing of multiple planes of memory cells at the same time. However, asynchronous sensing of multiple planes of memory cells presents certain challenges. For example, if a sensing operation for a different plane of memory cells connected its selected access line to the voltage regulator during the sensing phase of the first plane of memory cells, the voltage levels of trace 680 and trace 682 might be expected to drop, as depicted in traces 680' and 682', respectively. This could result in voltage levels of the unselected access lines of the first plane of memory cells dropping below a voltage level to act as a pass voltage, and could corrupt the sensing of the data state of the selected memory cell. Others have described methods of aligning asynchronous access operations seeking to avoid such noise injection during sensing phases. See, e.g., U.S. patent application Ser. No. 16/454,461 to Santis.

Various embodiments seek to mitigate such noise injection from asynchronous access operations without regard to aligning those access operations. For example, voltage generation and regulation circuitry might be configured to selectively connect an output of a voltage regulator to access lines of multiple planes of memory cells, and to selectively connect a respective voltage generation system to each plane of memory cells. The voltage regulator might be configured to receive the output of each of the voltage generation systems. In this manner, the voltage regulator might be connected (e.g., continuously connected) to receive a stable input voltage, e.g., from one or more of the voltage generation systems whose planes of memory cells are not experiencing a voltage drop from a corresponding access operation. As a further advantage, use of a single voltage regulator for multiple planes of memory cells as described can facilitate a reduction in size of voltage generation and regulation circuitry supporting asynchronous access operations. Logic and control circuitry might be provided to selectively connect the voltage regulator or the respective voltage generation system to access lines as will be described in more detail infra.

Figure 7:
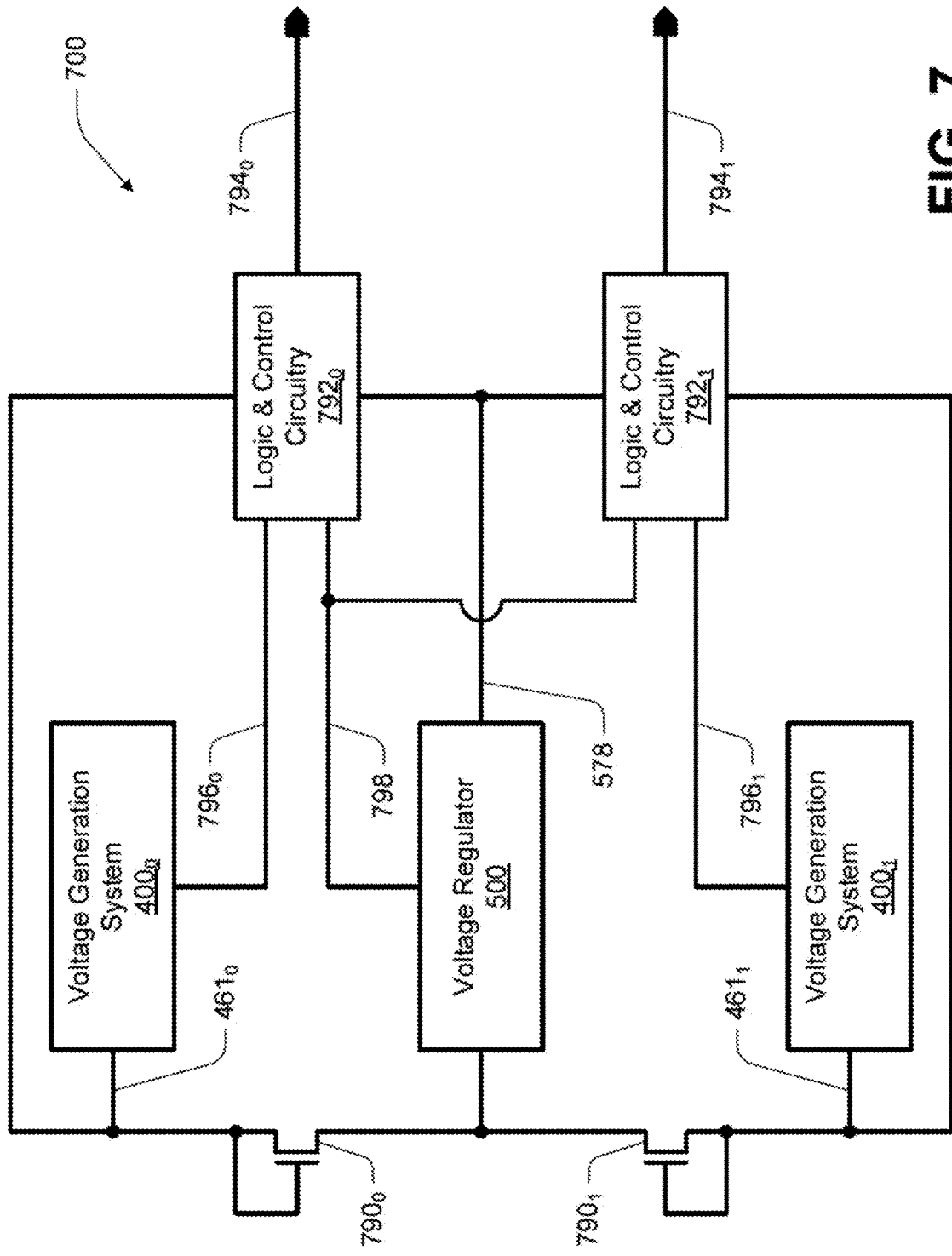
FIG. 7 is a block schematic of voltage generation and regulation circuitry in accordance with an embodiment.

FIG. 7 is a block schematic of voltage generation and regulation circuitry 700 in accordance with an embodiment. The voltage generation and regulation circuitry 700 might include a voltage regulator 500. The voltage regulator 500 might be connected to receive the output $461_0$ of a first voltage generation system $400_0$ through a diode $790_0$, and might be connected to receive the output $461_1$ of a second voltage generation system $400_1$ through a diode $790_1$. Although FIG. 7 depicts just two voltage generation systems 400, e.g., to support asynchronous access operations from two different planes of memory cells, additional voltage generation systems 400 might be similarly connected to support asynchronous access operations from additional planes of memory cells. For various embodiments, each of the voltage generation systems 400 and the voltage regulator 500 might be activated prior to connecting any access lines. Although embodiments described herein are not limited to any method of concurrent activation of the voltage generation systems and the voltage regulator, U.S. patent application Ser. No. 16/411,210 to Piccardi et al. describes how this can be performed. In addition, although the reference numbers 400 for voltage generation systems and 500 for the voltage regulator are used in FIG. 7, the voltage generation systems and voltage regulator of FIG. 7 need not conform to those depicted in FIGS. 4 and 5, respectively.

The voltage generation and regulation circuitry 700 might further include a first logic and control circuitry $792_0$, and a second logic and control circuitry $792_1$. The first logic and control circuitry $792_0$ might be connected to receive a first control signal $796_0$ from the voltage generation system $400_0$ and a second control signal 798 from the voltage regulator 500. The first logic and control circuitry $792_0$ might further be connected to receive the output $461_0$ from the voltage generation system $400_0$ as a first input voltage and the output 578 from the voltage regulator 500 as a second input voltage. The first logic and control circuitry $792_0$ might be configured to select either the first input voltage or the second input voltage for output to its output $794_0$ in response to one or more of its first control signal $796_0$ and second control signal 798.

The second logic and control circuitry $792_1$ might be connected to receive a first control signal $796_1$ from the voltage generation system $400_1$ and a second control signal 798 from the voltage regulator 500. The second logic and control circuitry $792_1$ might further be connected to receive the output $461_1$ from the voltage generation system $400_1$ as a first input voltage and the output 578 from the voltage regulator 500 as a second input voltage. The second logic and control circuitry $792_1$ might be configured to select either its first input voltage or its second input voltage for output to its output $794_1$ in response to one or more of its first control signal $796_1$ and second control signal 798.

Although FIG. 7 depicts just two logic and control circuitries 792, e.g., to support asynchronous access operations from two different planes of memory cells, additional logic and control circuitries 792 might be similarly connected to support asynchronous access operations from additional planes of memory cells. The first logic and control circuitry $792_0$ might have an output $794_0$ for connection to one or more access lines for its plane of memory cells, while the second logic and control circuitry $792_1$ might have an output $794_1$ for connection to one or more access lines for its plane of memory cells. As an example, the output 794 of a logic and control circuitry 792 might be connected (e.g., selectively connected) to one or more global access lines for its plane of memory cells.

For some embodiments, the output 794 of a logic and control circuitry 792 might be connected (e.g., selectively connected) to each of the global access lines for its plane of memory cells, and an internal controller, e.g., control logic 116, might be configured to select which of the global access lines would be connected to the output 794 of that logic and control circuitry 792 to perform a particular access operation. For example, with reference to FIG. 3, the global access lines $302_0$-$302_3$ might each be selectively connected to the output 794 of a logic and control circuitry 792, while only the global access lines $302_0$, $302_1$ and $302_3$ might be connected to the output 794 of that logic and control circuitry 792 to receive a single pass voltage for a read operation on a selected memory cell connected to the global access line $302_2$.

Figure 8A:
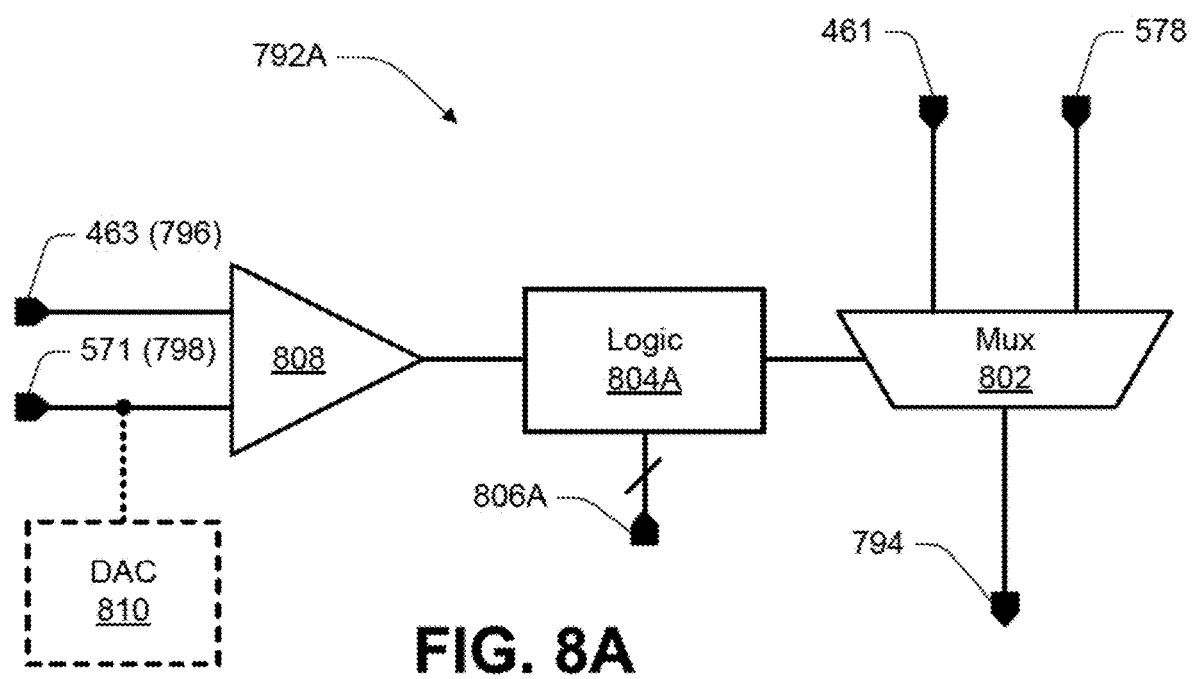
FIGS. 8A-8B are block schematics of logic and control circuitry for use with embodiments.
Figure 8B:
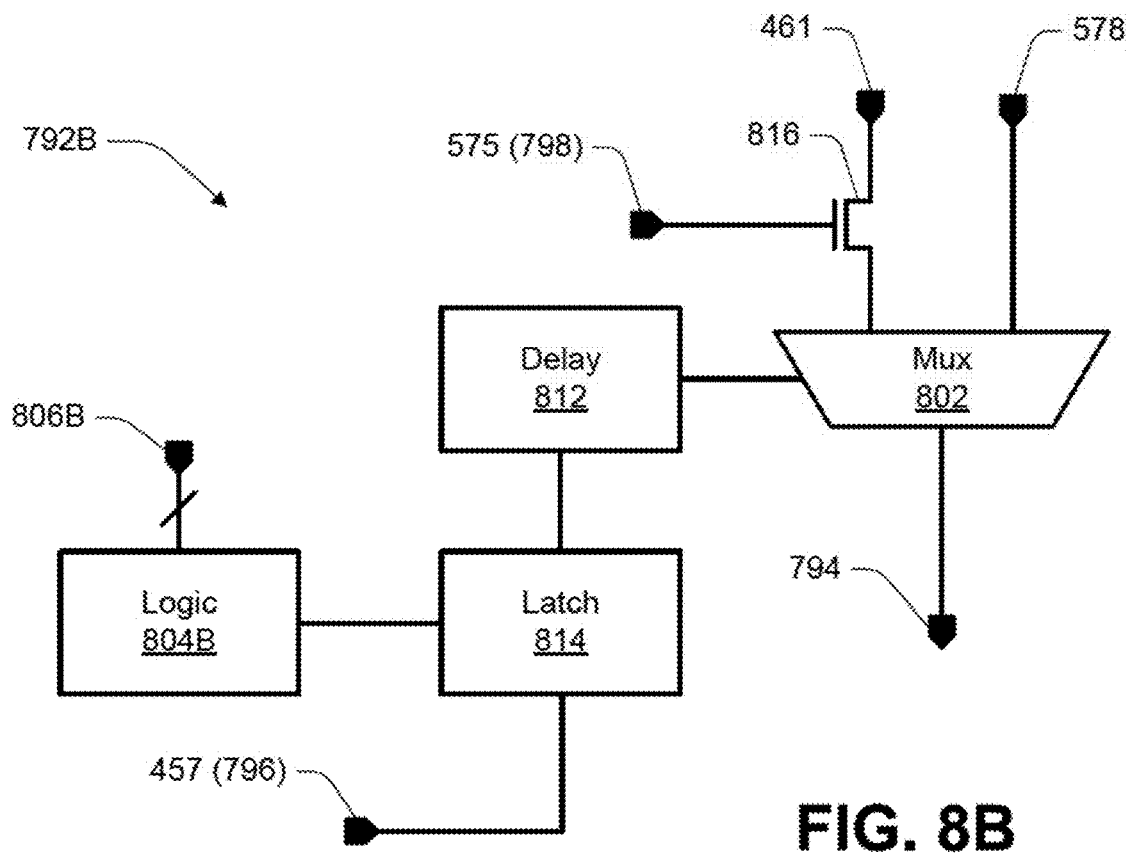

FIGS. 8A-8B are block schematics of logic and control circuitry 792 for use with embodiments. In FIG. 8A, the logic and control circuitry 792A might include a multiplexer (Mux) 802 to selectively connect the output 794 to either the output 578 of the voltage regulator or the output 461 of its corresponding voltage generation system. The mux 802 might be responsive to a control signal from logic 804A. Logic 804A might be responsive to control signals 806A, e.g., received from control logic 116, and further responsive to an output of a comparator 808. The comparator 808 might have a first input connected to receive a first voltage signal, e.g., a voltage level of the output 463 of a voltage divider of its voltage generation system, indicative of an output voltage level of its voltage generation system, which might correspond to a control signal 796 of FIG. 7 for this example. The comparator 808 might have a second input connected to receive a second voltage signal, e.g., a voltage level of the input 571 to an op-amp of the voltage regulator, indicative of a target voltage level of the voltage regulator, which might correspond to a control signal 798 of FIG. 7 for this example.

Alternatively, the second input of the comparator 808 might be connected to receive its second voltage level from a digital-to-analog converter (DAC) 810. The DAC 810 might be used to generate a voltage signal that is different than the voltage signal indicative of the target voltage level of the voltage regulator. For example, the DAC 810 might be used to adjust when the comparator 808 would transition logic levels, e.g., what voltage level of its first voltage signal would cause a transition. This might be used to adjust a timing of when the output 794 of the logic and control circuitry 792A would transition from being connected to the output of its voltage generation system to being connected to the output of the voltage regulator.

In general, the logic 804A of FIG. 8A might be configured to determine when an output of the comparator 808 indicates that the voltage level of the output of its voltage generation system exceeds its target voltage level for a first time after connection to its access line(s) pulls the output voltage level below its target voltage level. Control signals 806A might indicate to the logic 804A whether to monitor the output of the comparator 808 for a transition. For example, the control logic 116 might be aware of when an access line is connected to the output 794 of the mux 802, thus connecting its voltage generation system to the access line, and when the voltage level of its voltage generation system drops as a result, and can thus signal to the logic 804A when monitoring can begin. The logic 804A might be configured to initially have a first logic level, configured to cause the mux 802 to connect its output 794 to the output 461 of its voltage generation system, e.g., before monitoring the output of the comparator 808, and/or before connecting the output 794 to an access line. The logic 804A might be further configured to have a second logic level, configured to cause the mux 802 to connect its output 794 to the output 578 of the voltage regulator, after monitoring the output of the comparator 808 and detecting the transition (e.g., first transition).

In FIG. 8B, the logic and control circuitry 792B might include a multiplexer (Mux) 802 to selectively connect the output 794 to either the output 578 of the voltage regulator or the output 461 of its corresponding voltage generation system through a transistor (e.g., nFET) 816. The mux 802 might be responsive to a control signal from delay 812. The delay 812 might be an adjustable delay. The delay 812 might be configured to delay a signal from latch 814. The latch 814 might be configured to latch a signal from an output 457 of a comparator of its voltage generation system, which might indicate whether the output voltage level of its voltage generation system should be increased, e.g., whether it is below or above its target voltage level. This signal might correspond to the control signal 796 of FIG. 7 for this example.

The latch 814 might be further responsive to logic 804B. Logic 804B might be responsive to control signals 806B, e.g., received from control logic 116. In general, the logic 804B of FIG. 8B might be configured to set the latch 814 to an initial logic level, and to determine whether the latch 814 should monitor its control signal 796 to transition its logic level. Control signals 806B might indicate to the logic 804B when to set the latch 814 and when to monitor the output of the comparator 808 for a transition. For example, the control logic 116 might be aware of when voltage generation systems are activated, when an access line is connected to the output 794 of the mux 802, thus connecting its voltage generation system to the access line, and when the voltage level of its voltage generation system drops as a result, and can thus signal to the logic 804B when to set the logic level of the latch 814, and when monitoring can begin. The latch 814 might be configured to initially have a first logic level, configured to cause the mux 802 to connect its output 794 to the output 461 of its voltage generation system via the transistor 816, e.g., before monitoring its control signal 796, and/or before connecting the output 794 to an access line. The latch 814 might be further configured to have a second logic level, configured to cause the mux 802 to connect its output 794 to the output 578 of the voltage regulator, after monitoring its control signal 796 and detecting a transition (e.g., first transition) of its logic level.

The transistor 816 might have its control gate connected to receive the output 575 of an op-amp of the voltage regulator, which might correspond to a control signal 798 of FIG. 7 for this example. The transistor 816 might facilitate regulation of the voltage level from the output 461 of its voltage generation system to be provided to the mux 802, and thus its output 794. The transistor 816 might have a same configuration (e.g., type, length, width, etc.) as the transistor 576, e.g., in order to facilitate similar response to similar voltage levels. By providing the same control signal to transistor 816 as to transistor 576, the transistor 816 might be expected to regulate the voltage level provided to the mux 802 to be similar to (e.g., the same as) the voltage level of the output of the voltage regulator after the voltage level of the output 461 of its voltage generation system exceeds the voltage level of the output of the voltage regulator by the threshold voltage of the transistor 816.

Figure 9:
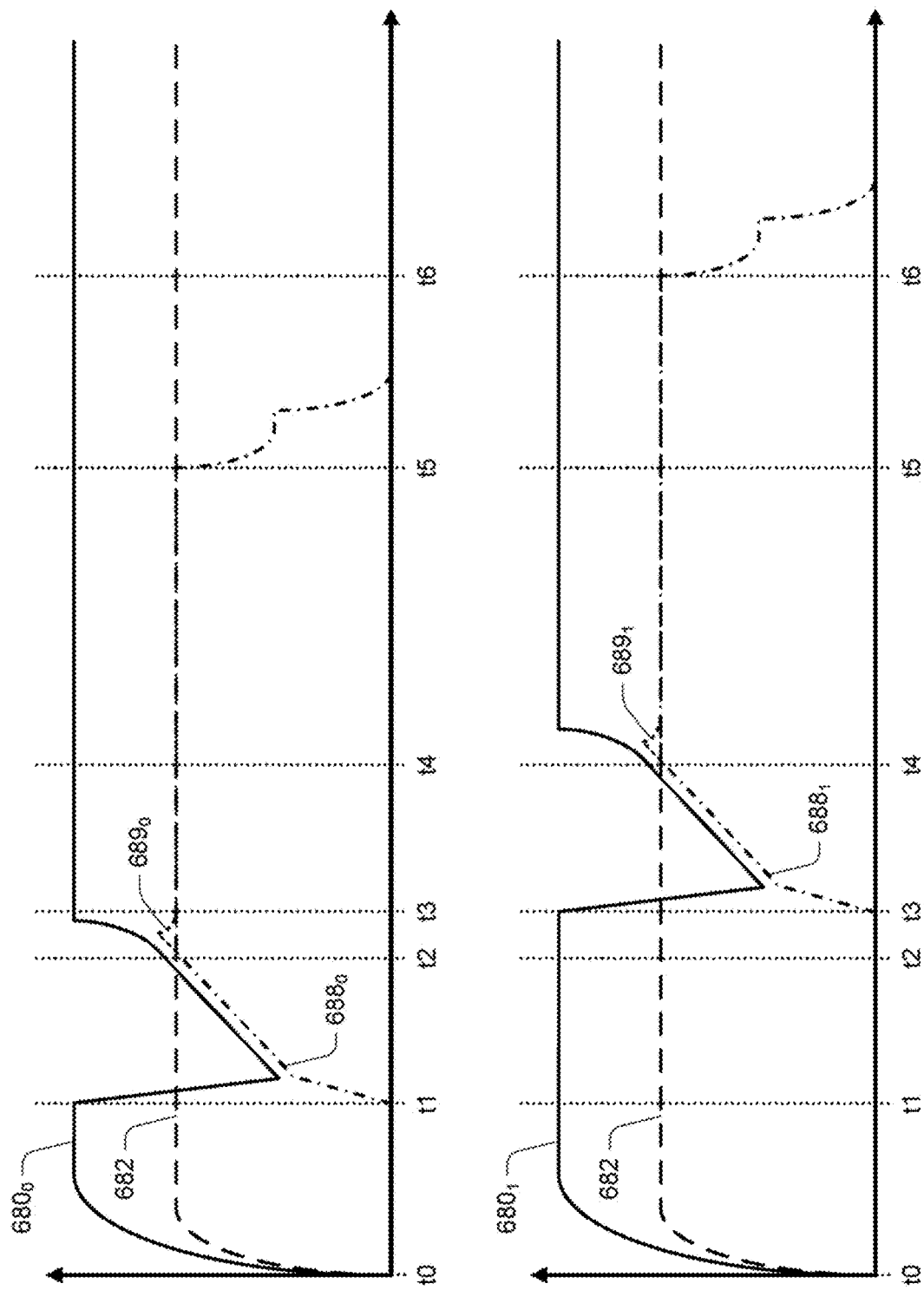
FIG. 9 are timing diagrams of voltage generation and regulation in accordance with an embodiment.

FIG. 9 are timing diagrams of voltage generation and regulation in accordance with an embodiment. Using a sensing operation in a NAND memory having a number of access lines connected to control gates of memory cells of a string of series-connected memory cells as an example, a selected access line connected to a control gate of a memory cell of the string selected for sensing might receive a voltage level to selectively activate that memory cell depending upon its data state, while remaining unselected access lines connected to control gates of other memory cells of the string might receive voltage levels, e.g., pass voltages, sufficient to activate those memory cells regardless of their data states. While one pass voltage might be used, it is not uncommon for a number of different pass voltages to be used. Each pass voltage might be generated using a respective voltage generation system and a respective voltage regulator. While each pass voltage might be generated using a respective voltage generation system and a respective voltage regulator, its respective voltage regulator might be connected to each unselected access line designated to receive that pass voltage during the sensing operation, which could include each access line connected to the string of series-connected memory cells other than the selected access line.

With reference to FIG. 9, trace $680_0$ might represent a voltage level of an output of a first voltage generation system while trace $680_1$ might represent a voltage level of an output of a second voltage generation system. Trace 682 might represent a voltage level of an output of a voltage regulator connected to receive the outputs of the first voltage generation system and the second voltage generation system through respective diodes. Trace $688_0$ might represent a voltage level of a first access line of a first plane of memory cells selectively connected to the first voltage generation system and to the voltage regulator, while trace $688_1$ might represent a voltage level of a second access line of a second plane of memory cells selectively connected to the second voltage generation system and to the voltage regulator.

At time t0, the first voltage generation system, the second voltage generation system, and the voltage regulator might be activated, and might rise to their target voltage levels. At time t1, the first access line might be connected to the output of the first voltage generation system. Due to the capacitance of the first access line (and other access lines that might be similarly connected), and the resulting increase in load of the first voltage generation system, trace $680_0$ might experience a large drop before increasing its voltage level back to its target voltage level. Unlike the prior art, trace 682 might generally be expected to maintain its voltage level due to the voltage regulator being connected to receive the output voltage level of the second voltage generation system. Traces $688_0$ might begin rising, following the voltage level of trace $680_0$.

At time t2, the first voltage generation system might reach an output voltage level indicative of a desire to connect the first access line to the output of the voltage regulator. It is noted that there may be an overshoot of the voltage level of the first access line as indicated by the portion $689_0$ of trace $688_0$. The extent of the overshoot can be controlled by various adjustments that can be made regarding when the decision to hand off from the voltage generation system to the voltage regulator occurs. A sensing operation on the first plane of memory cells containing the first access line might then occur as discussed with reference to FIG. 6.

At time t3, the second access line might be connected to the output of the second voltage generation system. Due to the capacitance of the second access line (and other access lines that might be similarly connected), and the resulting increase in load of the second voltage generation system, trace $680_1$ might experience a large drop before increasing its voltage level back to its target voltage level. Unlike the prior art, trace 682 might again be expected to maintain its voltage level due to the voltage regulator being connected to receive the output voltage level of the first voltage generation system. Traces $688_1$ might begin rising, following the voltage level of trace $680_1$.

At time t4, the second voltage generation system might reach an output voltage level indicative of a desire to connect the second access line to the output of the voltage regulator. It is noted that there may be an overshoot of the voltage level of the second access line as indicated by the portion $689_1$ of trace $688_1$. The extent of the overshoot can be controlled by various adjustments that can be made regarding when the decision to hand off from the voltage generation system to the voltage regulator occurs. A sensing operation on the second plane of memory cells containing the second access line might then occur as discussed with reference to FIG. 6.

Figure 10:
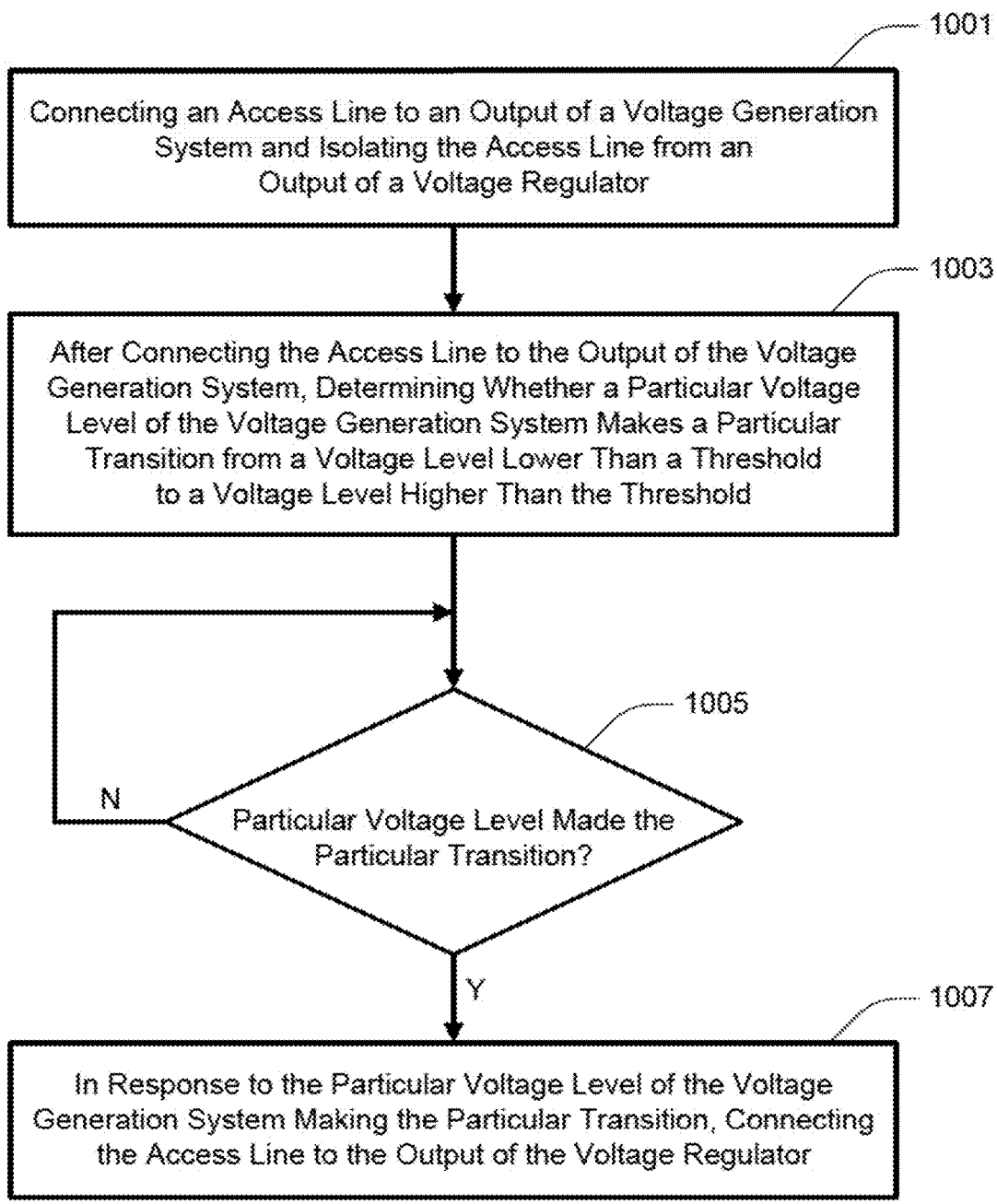
FIG. 10 is a flowchart of a method of operating an apparatus in accordance with an embodiment.

FIG. 10 is a flowchart of a method of operating an apparatus, e.g., a memory, in accordance with an embodiment. The method might represent actions associated with an access operation, e.g., a sensing operation or programming operation. The method might be in the form of computer-readable instructions, e.g., stored to the instruction registers 128. Such computer-readable instructions might be executed by a controller, e.g., the control logic 116, to cause the relevant components of the apparatus to perform the method.

At 1001, an access line might be connected to an output of a voltage generation system, and the access line might be isolated from an output of a voltage regulator. For example, the access line might be an access line, e.g., unselected access line or selected access line, to be used for the access operation. As one example, the access line might be an unselected access line for a sensing operation, e.g., to receive a pass voltage for the sensing operation. In this example, the voltage generation system might be configured to generate a voltage level higher than the pass voltage, while the voltage regulator might be configured to regulate a generated voltage level to the voltage level of the pass voltage. The voltage regulator might be connected to the output of the voltage generation system and one or more additional voltage generation system, such as described with reference to FIG. 7.

The access line might be a particular access line of a plurality of access lines connected to the output of the voltage generation system and isolated from the output of the voltage regulator. Continuing with the example, all unselected access lines of the sensing operation to receive the pass voltage (e.g., the same pass voltage) might be connected to the output of the voltage generation system and isolated from the output of the voltage regulator.

At 1003, after connecting the access line to the output of the voltage generation system, it might be determined whether a particular voltage level of the voltage generation system makes a particular transition from a voltage level lower than (or equal to) a threshold, to a voltage level higher (or equal to) the threshold. The particular voltage level of the voltage generation system might be indicative of an output voltage level of the voltage generation system. The threshold, relative to the particular voltage level, might be selected to indicate when the output voltage level of the voltage generation system is expected to be equal to, or higher than, a target voltage level of the voltage regulator. The determination might be made as discussed with reference to FIGS. 8A-8B, for example. If the particular voltage level of the voltage generation system makes the particular transition at 1005, the method might proceed to 1007. Alternatively, the method might continue to monitor for the particular transition at 1005 until such a transition is made.

At 1007, in response to determining that the particular voltage level of the voltage generation system made the particular transition, connecting the access line to the output of the voltage regulator. This might include disconnecting the access line from the output of the voltage generation system other than through its connection to the voltage regulator.

The method of FIG. 10 might be performed concurrently for multiple planes of memory cells, each corresponding to a respective voltage generation system, and each corresponding to the same voltage regulator. Various embodiments might limit performing an additional access operation on one of the planes of memory cells if the additional access operation would disturb the output voltage level of the voltage regulator. In other words, various embodiments might delay performing the additional access operation on one of the planes of memory cells until a voltage generation system of at least one other plane of memory cells has a sufficient output voltage level to maintain the output voltage level of the voltage regulator at its target voltage level.

It is noted that where the method of FIG. 10 is performed concurrently for multiple planes of memory cells, the access line(s) selectively connected to the same voltage regulator for each plane of memory cells might be the same or different relative to their respective selected memory cells for their respective access operations. Consider (e.g., with reference to FIGS. 2A, 2C and 2D) the example of performing a read operation on a selected memory cell $208_{x+1}$ in a block of memory cells $250_1$ in a plane of memory cells $242_0$ concurrently with performing a read operation on a selected memory cell $208_{x+2}$ in a block of memory cells $250_2$ in a plane of memory cells $242_1$. For simplicity, each read operation will be presumed to use only one pass voltage. In this example, the unselected access lines $202_0$-$202_x$ and $202_{x+2}$-$202_N$ of the block of memory cells $250_1$ in the plane of memory cells $242_0$ could be selectively connected to the voltage regulator to receive the pass voltage, while the unselected access lines $202_0$-$202_{x+1}$ and $202_{x+3}$-$202_N$ of the block of memory cells $250_2$ in the plane of memory cells $242_1$ could be selectively connected to the voltage regulator to receive the pass voltage. Conversely, if this example were changed to performing the read operation on the selected memory cell $208_{x+1}$ in the block of memory cells $250_1$ in the plane of memory cells $242_0$ concurrently with performing the read operation on a selected memory cell $208_{x+1}$ in the block of memory cells $250_2$ in the plane of memory cells $242_1$, the unselected access lines $202_0$-$202_x$ and $202_{x+2}$-$202_N$ of both the block of memory cells $250_1$ in the plane of memory cells $242_0$, and the block of memory cells $250_2$ in the plane of memory cells $242_1$, could be selectively connected to the voltage regulator to receive the pass voltage. While the foregoing examples used the same access operation, different access operations could be concurrently performed using a single voltage regulator for a particular voltage level where each of the concurrent access operations use that voltage level. For example, one or more pass voltages for a read operation on one plane of memory cells might be the same voltage level as one or more pass voltages for a programming operation on a different plane of memory cells.

The method of FIG. 10 might be further performed concurrently for multiple access lines of a same plane of memory cells. For example, at 1001, the access line might be a first access line connected to a first voltage generation system and isolated from a first voltage regulator. The first voltage regulator might be configured to provide a first voltage level to the first access line for the access operation. A second access line to receive a second voltage level, different than the first voltage level, for the access operation might be connected to the output of a second voltage generation system and isolated from a second voltage regulator concurrently with connecting the first access line to the first voltage generation system and isolating the first access line from the first voltage regulator. The second voltage regulator might be configured to provide the second voltage level to the second access line for the access operation. The remainder of the method of FIG. 10 might continue to be performed concurrently for each of the access lines in relation to their respective voltage generation systems and voltage regulators.

Figure 11:
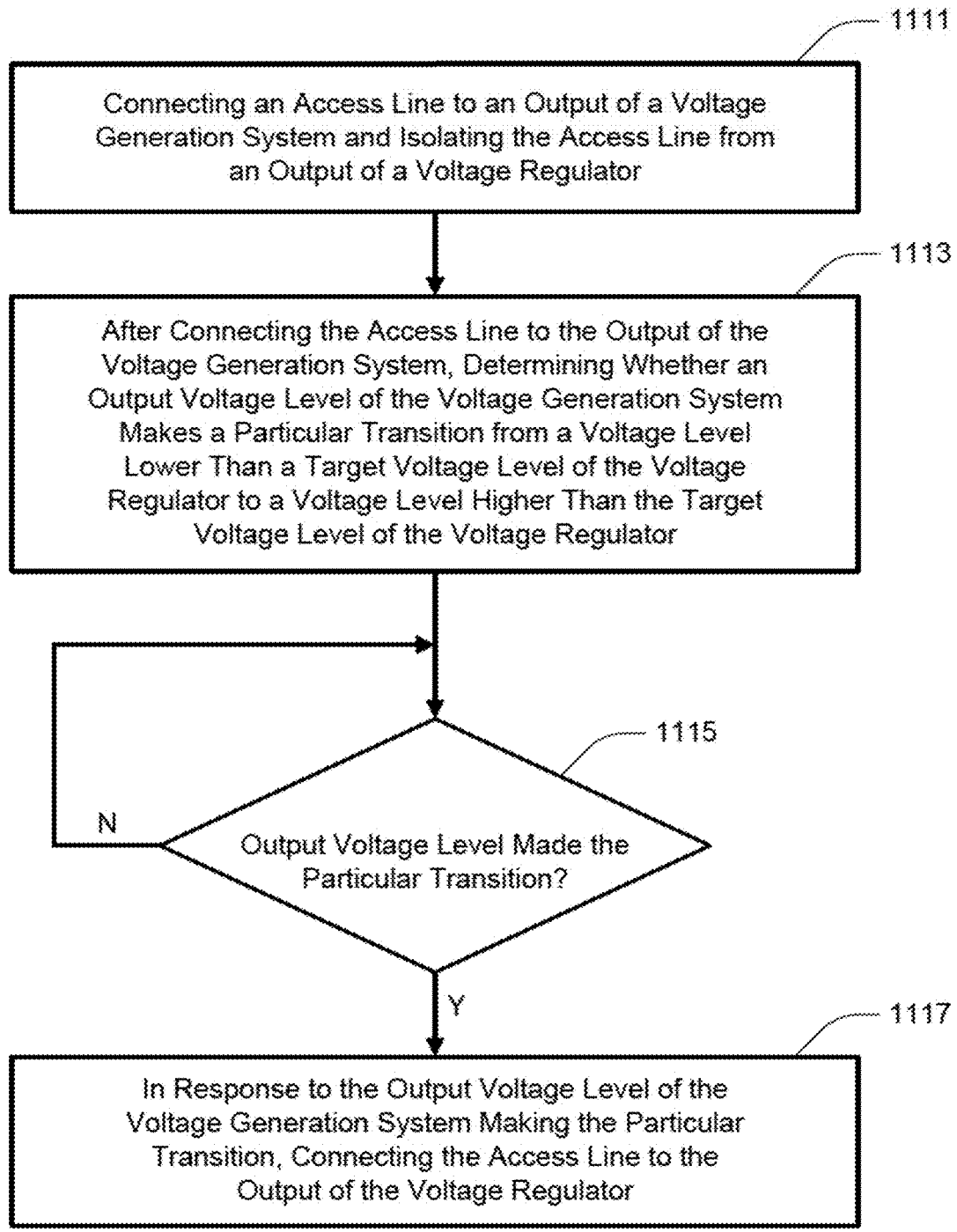
FIG. 11 is a flowchart of a method of operating an apparatus in accordance with another embodiment.

FIG. 11 is a flowchart of a method of operating an apparatus, e.g., a memory, in accordance with another embodiment. The method might represent actions associated with an access operation, e.g., a sensing operation or programming operation. The method might be in the form of computer-readable instructions, e.g., stored to the instruction registers 128. Such computer-readable instructions might be executed by a controller, e.g., the control logic 116, to cause the relevant components of the apparatus to perform the method.

At 1111, an access line might be connected to an output of a voltage generation system, and the access line might be isolated from an output of a voltage regulator. For example, the access line might be an access line, e.g., unselected access line or selected access line, to be used for the access operation. As one example, the access line might be an unselected access line for a sensing operation, e.g., to receive a pass voltage for the sensing operation. In this example, the voltage generation system might be configured to generate a voltage level higher than the pass voltage, while the voltage regulator might be configured to regulate a generated voltage level to the voltage level of the pass voltage. The voltage regulator might be connected to the output of the voltage generation system and one or more additional voltage generation system, such as described with reference to FIG. 7.

The access line might be a particular access line of a plurality of access lines connected to the output of the voltage generation system and isolated from the output of the voltage regulator. Continuing with the example, all unselected access lines of the sensing operation to receive the pass voltage (e.g., the same pass voltage) might be connected to the output of the voltage generation system and isolated from the output of the voltage regulator.

At 1113, after connecting the access line to the output of the voltage generation system, it might be determined whether an output voltage level of the voltage generation system makes a particular transition from a voltage level lower than (or equal to) a target voltage level of the voltage regulator, to a voltage level higher (or equal to) the target voltage level of the voltage regulator. The determination might be made as discussed with reference to FIG. 8A, for example. If the output voltage level of the voltage generation system makes the particular transition at 1115, the method might proceed to 1117. Alternatively, the method might continue to monitor for the particular transition at 1115 until such a transition is made.

At 1117, in response to determining that the output voltage level of the voltage generation system made the particular transition, connecting the access line to the output of the voltage regulator. This might include disconnecting the access line from the output of the voltage generation system other than through its connection to the voltage regulator.

The method of FIG. 11 might be performed concurrently for multiple planes of memory cells, each corresponding to a respective voltage generation system, and each corresponding to the same voltage regulator. Various embodiments might limit performing an additional access operation on one of the planes of memory cells if the additional access operation would disturb the output voltage level of the voltage regulator. In other words, various embodiments might delay performing the additional access operation on one of the planes of memory cells until a voltage generation system of at least one other plane of memory cells has a sufficient output voltage level to maintain the output voltage level of the voltage regulator at its target voltage level.

It is noted that where the method of FIG. 11 is performed concurrently for multiple planes of memory cells, the access line(s) selectively connected to the same voltage regulator for each plane of memory cells might be the same or different relative to their respective selected memory cells for their respective access operations, as discussed with reference to FIG. 10.

The method of FIG. 11 might be further performed concurrently for multiple access lines of a same plane of memory cells. For example, at 1111, the access line might be a first access line connected to a first voltage generation system and isolated from a first voltage regulator. The first voltage regulator might be configured to provide a first voltage level to the first access line for the access operation. A second access line to receive a second voltage level, different than the first voltage level, for the access operation might be connected to the output of a second voltage generation system and isolated from a second voltage regulator concurrently with connecting the first access line to the first voltage generation system and isolating the first access line from the first voltage regulator. The second voltage regulator might be configured to provide the second voltage level to the second access line for the access operation. The remainder of the method of FIG. 11 might continue to be performed concurrently for each of the access lines in relation to their respective voltage generation systems and voltage regulators.

Figure 12:
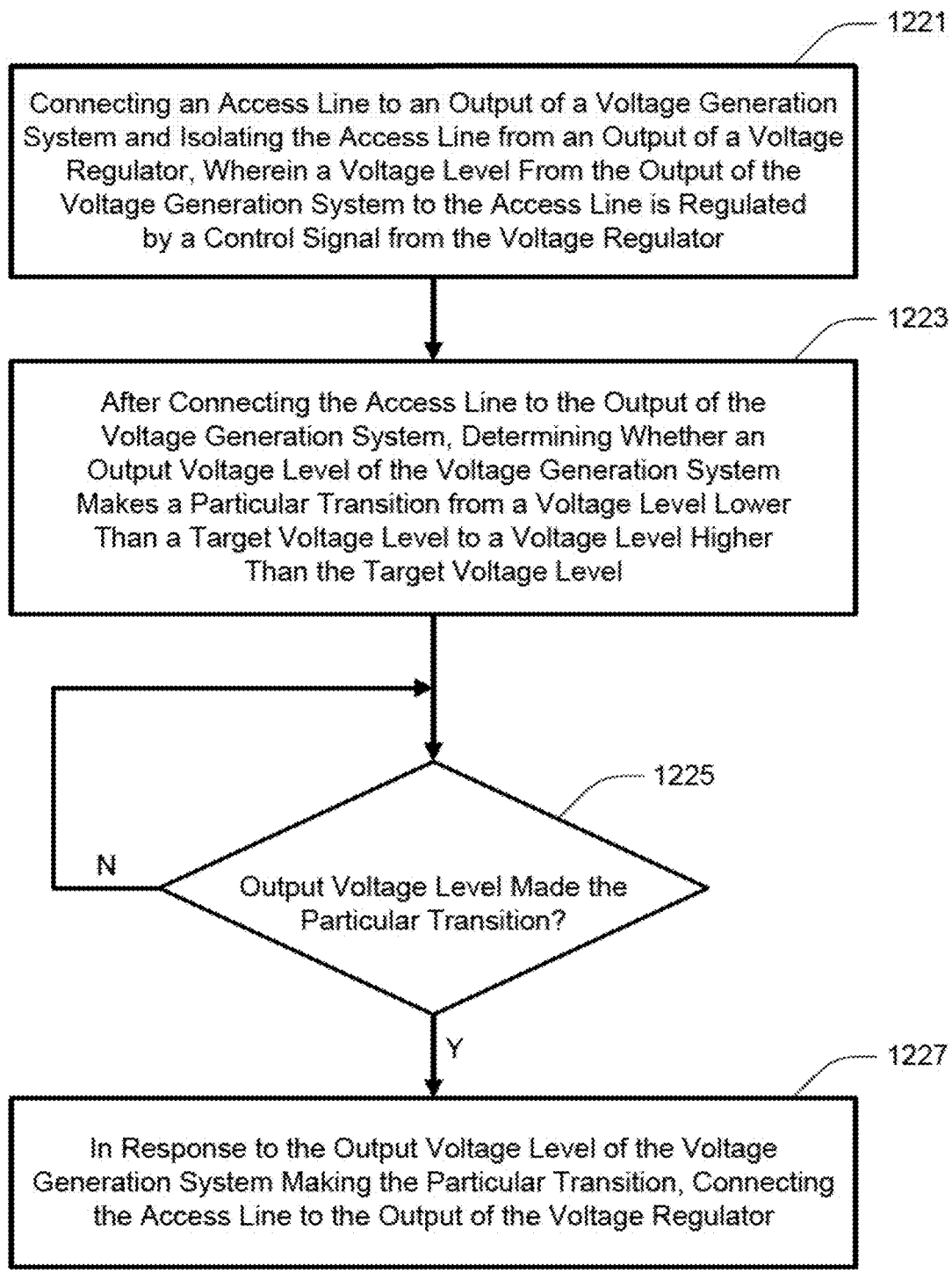
FIG. 12 is a flowchart of a method of operating an apparatus in accordance with a further embodiment.

FIG. 12 is a flowchart of a method of operating an apparatus, e.g., a memory, in accordance with a further embodiment. The method might represent actions associated with an access operation, e.g., a sensing operation or programming operation. The method might be in the form of computer-readable instructions, e.g., stored to the instruction registers 128. Such computer-readable instructions might be executed by a controller, e.g., the control logic 116, to cause the relevant components of the apparatus to perform the method.

At 1221, an access line might be connected to an output of a voltage generation system, and the access line might be isolated from an output of a voltage regulator. For example, the access line might be an access line, e.g., unselected access line or selected access line, to be used for the access operation. As one example, the access line might be an unselected access line for a sensing operation, e.g., to receive a pass voltage for the sensing operation. In this example, the voltage generation system might be configured to generate a voltage level higher than the pass voltage, while the voltage regulator might be configured to regulate a generated voltage level to the voltage level of the pass voltage. The voltage regulator might be connected to the output of the voltage generation system and one or more additional voltage generation system, such as described with reference to FIG. 7. A voltage level from the output of the voltage generation system might be regulated by a control signal from the voltage regulator.

The access line might be a particular access line of a plurality of access lines connected to the output of the voltage generation system and isolated from the output of the voltage regulator. Continuing with the example, all unselected access lines of the sensing operation to receive the pass voltage (e.g., the same pass voltage) might be connected to the output of the voltage generation system and isolated from the output of the voltage regulator.

At 1223, after connecting the access line to the output of the voltage generation system, it might be determined whether an output voltage level of the voltage generation system makes a particular transition from a voltage level lower than (or equal to) a target voltage level of the voltage generation system, to a voltage level higher (or equal to) the target voltage level of the voltage generation system. The determination might be made as discussed with reference to FIG. 8B, for example. If the output voltage level of the voltage generation system makes the particular transition at 1225, the method might proceed to 1227. Alternatively, the method might continue to monitor for the particular transition at 1225 until such a transition is made.

At 1227, in response to determining that the output voltage level of the voltage generation system made the particular transition, connecting the access line to the output of the voltage regulator. This might include disconnecting the access line from the output of the voltage generation system other than through its connection to the voltage regulator.

The method of FIG. 12 might be performed concurrently for multiple planes of memory cells, each corresponding to a respective voltage generation system, and each corresponding to the same voltage regulator. Various embodiments might limit performing an additional access operation on one of the planes of memory cells if the additional access operation would disturb the output voltage level of the voltage regulator. In other words, various embodiments might delay performing the additional access operation on one of the planes of memory cells until a voltage generation system of at least one other plane of memory cells has a sufficient output voltage level to maintain the output voltage level of the voltage regulator at its target voltage level.

It is noted that where the method of FIG. 12 is performed concurrently for multiple planes of memory cells, the access line(s) selectively connected to the same voltage regulator for each plane of memory cells might be the same or different relative to their respective selected memory cells for their respective access operations, as discussed with reference to FIG. 10.

The method of FIG. 12 might be further performed concurrently for multiple access lines of a same plane of memory cells. For example, at 1221, the access line might be a first access line connected to a first voltage generation system and isolated from a first voltage regulator. The first voltage regulator might be configured to provide a first voltage level to the first access line for the access operation. A second access line to receive a second voltage level, different than the first voltage level, for the access operation might be connected to the output of a second voltage generation system and isolated from a second voltage regulator concurrently with connecting the first access line to the first voltage generation system and isolating the first access line from the first voltage regulator. The second voltage regulator might be configured to provide the second voltage level to the second access line for the access operation. The remainder of the method of FIG. 12 might continue to be performed concurrently for each of the access lines in relation to their respective voltage generation systems and voltage regulators.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
   connecting an access line of a plurality of access lines to an output of a voltage generation system and isolating the access line from an output of a voltage regulator, wherein each access line of the plurality of access lines is connected to control gates of a respective plurality of memory cells;
   after connecting the access line to the output of the voltage generation system, determining whether a particular voltage level of the voltage generation system makes a particular transition from a voltage level lower than a threshold to a voltage level higher than the threshold; and
   in response to determining that the particular voltage level of the voltage generation system made the particular transition, connecting the access line to the output of the voltage regulator.

2. The method of claim 1, wherein isolating the access line from the output of the voltage regulator comprises isolating the access line from the output of a voltage regulator connected to the output of the voltage generation system through a diode.

3. The method of claim 1, wherein isolating the access line from the output of the voltage regulator connected to the output of the voltage generation system through a diode comprises isolating the access line from the output of a voltage regulator connected to the output of the voltage generation system through the diode and connected to the output of a different voltage generation system through a different diode.

4. The method of claim 1, wherein determining whether the particular voltage level of the voltage generation system makes the particular transition from the voltage level lower than the threshold to the voltage level higher than the threshold comprises a criterion selected from a group consisting of determining whether the voltage level of the voltage generation system makes the particular transition from a voltage level lower than or equal to the threshold to the voltage level higher than the threshold, and determining whether the voltage level of the voltage generation system makes the particular transition from the voltage level lower than the threshold to a voltage level higher than or equal to the threshold.

5. The method of claim 1, wherein determining whether the particular voltage level of the voltage generation system makes the particular transition from the voltage level lower than the threshold to the voltage level higher than the threshold comprises a threshold selected from a group consisting of a voltage level indicative of a target voltage level of the output of the voltage generation system, a voltage level indicative of a target voltage level of the voltage regulator, and a voltage level higher than the voltage level indicative of the target voltage level of the voltage regulator.

6. The method of claim 1, wherein connecting the access line to the output of the voltage regulator further comprises disconnecting the access line from the output of the voltage generation system other than through a connection to the voltage regulator.

7. The method of claim 1, wherein connecting the access line of the plurality of access lines to the output of the voltage generation system and isolating the access line from the output of the voltage regulator comprises connecting the access line and one or more additional access lines of the plurality of access lines to the output of the voltage generation system and isolating the access line and the one or more additional access lines from the output of the voltage regulator.

8. The method of claim 1, wherein the access line is a first access line of the plurality of access lines, wherein the voltage generation system is a first voltage generation system, wherein the threshold is a first threshold, and wherein the voltage regulator is a first voltage regulator, the method further comprising:
   connecting a second access line of the plurality of access lines to an output of a second voltage generation system and isolating the second access line from an output of a second voltage regulator;
   after connecting the second access line to the output of the second voltage generation system, determining whether a particular voltage level of the second voltage generation system makes a particular transition from a voltage level lower than a second threshold to a voltage level higher than the second threshold; and
   in response to determining that the particular voltage level of the second voltage generation system made its particular transition, connecting the second access line to the output of the second voltage regulator.

9. An apparatus, comprising:
   an array of memory cells comprising a plurality of groupings of memory cells;
   a plurality of access lines, each access line of the plurality of access lines connected to control gates of a respective grouping of memory cells of the plurality of groupings of memory cells;
   a first voltage generation system comprising an output selectively connected to a first access line of the plurality of access lines;
   a second voltage generation system comprising an output selectively connected to a second access line of the plurality of access lines;
   a first voltage regulator comprising an output selectively connected to the first access line, and comprising an input connected to the output of the first voltage generation system;
   a second voltage regulator comprising an output selectively connected to the second access line, and comprising an input connected to the output of the second voltage generation system; and
   a controller for accessing the array of memory cells, wherein the controller is configured to cause the apparatus to:
      connect the first access line to the output of the first voltage generation system and isolate the first access line from the output of the first voltage regulator;
      connect the second access line to the output of the second voltage generation system and isolating the second access line from the output of the second voltage regulator;
      after connecting the first access line to the output of the first voltage generation system, determine whether a particular voltage level of the first voltage generation system makes a particular transition from a voltage level lower than a first threshold to a voltage level higher than the first threshold;
      after connecting the second access line to the output of the second voltage generation system, determine whether a particular voltage level of the second voltage generation system makes a particular transition from a voltage level lower than a second threshold to a voltage level higher than the second threshold;
      in response to determining that the particular voltage level of the first voltage generation system made its particular transition, connect the first access line to the output of the first voltage regulator; and
      in response to determining that the particular voltage level of the second voltage generation system made its particular transition, connect the second access line to the output of the second voltage regulator.

10. The apparatus of claim 9, wherein the controller being configured to cause the apparatus to connect the first access line to the output of the first voltage regulator and connect the second access line to the output of the second voltage regulator comprises the controller being configured to cause the apparatus to connect the second access line to the output of the second voltage generation system at a same time as connecting the first access line to the output of the first voltage generation system.

11. The apparatus of claim 9, wherein the controller being configured to cause the apparatus to connect the first access line to the output of the first voltage regulator and connect the second access line to the output of the second voltage regulator comprises the controller being configured to cause the apparatus to connect the first access line to the output of the first voltage regulator to receive a first voltage level for performing an access operation and connect the second access line to the output of the second voltage regulator to receive a second voltage level, different than the first voltage level, for performing the access operation.

12. The apparatus of claim 9, wherein the plurality of access lines is a first plurality of access lines of a first plane of memory cells of the array of memory cells, the apparatus further comprising:
   a third voltage generation system comprising an output selectively connected to a first access line of a second plurality of access lines of a second plane of memory cells of the array of memory cells, wherein the input of the first voltage regulator is further connected to the output of the third voltage generation system;
   wherein the controller is further configured to cause the apparatus to:
      connect the first access line of the second plurality of access lines to the output of the third voltage generation system and isolate the first access line of the second plurality of access lines from the output of the first voltage regulator;
      after connecting the first access line of the second plurality of access lines to the output of the third voltage generation system, determine whether a particular voltage level of the third voltage generation system makes a particular transition from the voltage level lower than the first threshold to the voltage level higher than the first threshold; and
      in response to determining that the particular voltage level of the third voltage generation system made its particular transition, connect the first access line of the second plurality of access lines to the output of the first voltage regulator.

13. The apparatus of claim 12, wherein the controller is further configured to cause the apparatus to delay connecting the first access line of the second plurality of access lines to the output of the third voltage generation system if connecting the first access line of the second plurality of access lines would disturb an output voltage level of the first voltage regulator.

14. The apparatus of claim 12, wherein the controller is further configured to cause the apparatus to connect the first access line of the second plurality of access lines to the output of the second voltage generation system after connecting the first access line of the first plurality of access lines to the output of the first voltage generation system.

15. An apparatus, comprising:
an array of memory cells comprising a plurality of groupings of memory cells;
a plurality of access lines, each access line of the plurality of access lines connected to control gates of a respective grouping of memory cells of the plurality of groupings of memory cells;
a voltage generation system comprising an output selectively connected to a particular access line of the plurality of access lines;
a voltage regulator comprising an output selectively connected to the particular access line, and comprising an input connected to the output of the voltage generation system; and
a controller for accessing the array of memory cells, wherein the controller is configured to cause the apparatus to:
connect the particular access line to the output of the voltage generation system and isolate the particular access line from the output of the voltage regulator;
after connecting the particular access line to the output of the voltage generation system, determine whether an output voltage level of the voltage generation system makes a particular transition from a voltage level lower than a target voltage level of the voltage regulator to a voltage level higher than the target voltage level of the voltage regulator; and
in response to determining that the output voltage level of the voltage generation system made the particular transition, connect the particular access line to the output of the voltage regulator.

16. An apparatus, comprising:
an array of memory cells comprising a plurality of groupings of memory cells;
a plurality of access lines, each access line of the plurality of access lines connected to control gates of a respective grouping of memory cells of the plurality of groupings of memory cells;
a voltage generation system comprising an output selectively connected to a particular access line of the plurality of access lines;
a voltage regulator comprising an output selectively connected to the particular access line, and comprising an input connected to the output of the voltage generation system, wherein a voltage level from the output of the voltage generation system to the particular access line is regulated by a control signal from the voltage regulator; and
a controller for accessing the array of memory cells, wherein the controller is configured to cause the apparatus to:
connect the particular access line to the output of the voltage generation system and isolate the particular access line from the output of the voltage regulator;
after connecting the particular access line to the output of the voltage generation system, determine whether an output voltage level of the voltage generation system makes a particular transition from a voltage level lower than a target voltage level of the voltage generation system to a voltage level higher than the target voltage level of the voltage generation system; and
in response to determining that the output voltage level of the voltage generation system made the particular transition, connect the particular access line to the output of the voltage regulator.

17. An apparatus, comprising:
an array of memory cells comprising a plurality of groupings of memory cells;
a plurality of access lines, each access line of the plurality of access lines connected to control gates of a respective grouping of memory cells of the plurality of groupings of memory cells;
a voltage generation system comprising an output selectively connected to a particular access line of the plurality of access lines;
a voltage regulator comprising an output selectively connected to the particular access line, and comprising an input connected to the output of the voltage generation system; and
a controller for accessing the array of memory cells, wherein the controller is configured to cause the apparatus to:
connect the particular access line to the output of the voltage generation system and isolate the particular access line from the output of the voltage regulator;
after connecting the particular access line to the output of the voltage generation system, determine whether a particular voltage level of the voltage generation system makes a particular transition from a voltage level lower than a threshold to a voltage level higher than the threshold; and
in response to determining that the particular voltage level of the voltage generation system made the particular transition, connect the particular access line to the output of the voltage regulator.

18. The apparatus of claim 17, wherein the voltage generation system comprises a charge pump.

19. The apparatus of claim 17, wherein the voltage regulator comprises a linear voltage regulator.

20. The apparatus of claim 17, wherein the voltage generation system is a particular voltage generation system of a plurality of voltage generation systems, and wherein the input of the voltage regulator is connected to an output of each voltage generation system of the plurality of voltage generation systems.

21. The apparatus of claim 20, wherein the input of the voltage regulator is connected to the output of each voltage generation system of the plurality of voltage generation systems through a respective diode.

22. The apparatus of claim 17, wherein the controller is configured to cause the apparatus to connect the particular access line to the output of the voltage generation system for charging the particular access line prior to performing an access operation, and wherein the controller is further configured to cause the apparatus to perform the access operation while the particular access line is connected to the output of the voltage regulator.

23. The apparatus of claim 17, wherein the controller being configured to cause the apparatus to determine whether the particular voltage level of the voltage generation system makes the particular transition from the voltage level lower than the threshold to the voltage level higher than the threshold comprises the controller being configured to cause the apparatus to use a criterion selected from a group consisting of determining whether the voltage level of the voltage generation system makes the particular transition from a voltage level lower than or equal to the threshold to the voltage level higher than the threshold, and determining whether the voltage level of the voltage generation system makes the particular transition from the voltage level lower than the threshold to a voltage level higher than or equal to the threshold.

24. The apparatus of claim 17, wherein the controller being configured to cause the apparatus to determine whether the particular voltage level of the voltage generation system makes the particular transition from the voltage level lower than the threshold to the voltage level higher than the threshold comprises the controller being configured to cause the apparatus to delay the determination until connecting the particular access line results in a drop in a voltage level of the output of the voltage generation system.

25. An apparatus, comprising:
- an array of memory cells comprising a plurality of planes of memory cells, wherein each plane of memory cells comprises a respective plurality of access lines, and wherein, for each plane of memory cells of the plurality of planes of memory cells, each access line of its respective plurality of access lines is connected to control gates of a respective plurality of memory cells of that plane of memory cells;
- a plurality of voltage generation systems, each comprising an output selectively connected to a particular access line of the respective plurality of access lines for a respective plane of memory cells of the plurality of planes of memory cells;
- a voltage regulator comprising an output selectively connected to the particular access line for each plane of memory cells of the plurality of planes of memory cells, and comprising an input connected to the output of each voltage generation system of the plurality of voltage generation systems; and
- a controller for accessing the array of memory cells, wherein the controller, for each plane of memory cells of the plurality of planes of memory cells, is configured to cause the apparatus to:
  - connect the particular access line for the respective plurality of access lines for that plane of memory cells to the output of its respective voltage generation system of the plurality of voltage generation systems, and isolate the particular access line for the respective plurality of access lines for that plane of memory cells from the output of the voltage regulator;
  - after connecting the particular access line for the respective plurality of access lines for that plane of memory cells to the output of its respective voltage generation system of the plurality of voltage generation systems, determine whether a particular voltage level of its respective voltage generation system of the plurality of voltage generation systems makes a particular transition from a voltage level lower than a threshold to a voltage level higher than the threshold; and
  - in response to determining that the particular voltage level of its respective voltage generation system of the plurality of voltage generation systems made its particular transition, connect the particular access line for the respective plurality of access lines for that plane of memory cells to the output of the voltage regulator.

* * * * *